US 9,685,879 B2

United States Patent
Obiraki et al.

(10) Patent No.: US 9,685,879 B2
(45) Date of Patent: Jun. 20, 2017

(54) POWER SEMICONDUCTOR MODULE AND POWER CONVERSION DEVICE

(71) Applicant: Mitsubishi Electric Corporation, Tokyo (JP)

(72) Inventors: Yoshiko Obiraki, Chiyoda-ku (JP); Yasushi Nakayama, Chiyoda-ku (JP); Yuji Miyazaki, Chiyoda-ku (JP); Hiroshi Nakatake, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/992,762

(22) Filed: Jan. 11, 2016

(65) Prior Publication Data

US 2016/0172995 A1 Jun. 16, 2016

Related U.S. Application Data

(63) Continuation of application No. 14/381,339, filed as application No. PCT/JP2013/000137 on Jan. 16, 2013.

(30) Foreign Application Priority Data

Mar. 1, 2012 (JP) .................................. 2012-045611

(51) Int. Cl.
*H02M 7/00* (2006.01)
*H01L 25/07* (2006.01)
(Continued)

(52) U.S. Cl.
CPC .......... *H02M 7/003* (2013.01); *H01L 25/072* (2013.01); *H01L 25/162* (2013.01); *H02M 7/537* (2013.01);
(Continued)

(58) Field of Classification Search
CPC ............................. H02M 3/007; H02M 7/003
See application file for complete search history.

(56) References Cited

U.S. PATENT DOCUMENTS

| 5,617,293 A | 4/1997 | Schulze et al. |
| 6,188,589 B1 * | 2/2001 | Okayama ............... H02M 1/34 |
| | | 363/136 |

(Continued)

FOREIGN PATENT DOCUMENTS

| CN | 101452925 A | 6/2009 |
| CN | 102067309 A | 5/2011 |

(Continued)

OTHER PUBLICATIONS

Office Action issued Nov. 10, 2015 in Japanese Patent Application No. 2014-175818 (with English language translation).

(Continued)

*Primary Examiner* — Fred E Finch, III
*Assistant Examiner* — Rafael O De Leon Domenech
(74) *Attorney, Agent, or Firm* — Oblon, McClelland, Maier & Neustadt, L.L.P.

(57) ABSTRACT

A power semiconductor module capable of reducing variation of inductance between upper/lower arms and reducing variation of current caused by the variation of inductance. The power semiconductor module includes circuit blocks (upper/lower arms) each of which is configured by connecting self-arc-extinguishing type semiconductor elements in series; first and second positive electrode terminals, first and second negative electrode terminals, and first and second AC terminals. Further, there are first and second wiring patterns that connect the self-arc-extinguishing type semiconductor elements to the DC and AC terminals. The outline of the power semiconductor module has a substantially quadrangular surface.

20 Claims, 18 Drawing Sheets

(51) Int. Cl.

| | | |
|---|---|---|
| *H01L 25/16* | (2006.01) | |
| *H02M 7/537* | (2006.01) | |
| *H05K 5/00* | (2006.01) | |
| *H05K 7/20* | (2006.01) | |
| *H01L 25/18* | (2006.01) | |
| *H01L 23/498* | (2006.01) | |
| *H01L 23/538* | (2006.01) | |

(52) U.S. Cl.
CPC ......... *H05K 5/0021* (2013.01); *H05K 5/0065* (2013.01); *H05K 7/2039* (2013.01); *H01L 23/49811* (2013.01); *H01L 23/49844* (2013.01); *H01L 23/5385* (2013.01); *H01L 25/18* (2013.01); *H01L 2224/32225* (2013.01); *H01L 2224/48091* (2013.01); *H01L 2224/48137* (2013.01); *H01L 2224/48139* (2013.01); *H01L 2224/48227* (2013.01); *H01L 2224/49111* (2013.01); *H01L 2224/49113* (2013.01); *H01L 2224/73265* (2013.01); *H01L 2924/1033* (2013.01); *H01L 2924/10254* (2013.01); *H01L 2924/10272* (2013.01); *H01L 2924/12032* (2013.01); *H01L 2924/1305* (2013.01); *H01L 2924/13055* (2013.01); *H01L 2924/13091* (2013.01); *H01L 2924/19107* (2013.01); *H01L 2924/30107* (2013.01)

(56) References Cited

U.S. PATENT DOCUMENTS

2009/0140414 A1 6/2009 Soyano et al.
2009/0257211 A1 10/2009 Kontani et al.
2011/0062491 A1 3/2011 Nakata
2013/0063067 A1 3/2013 Tanaka

FOREIGN PATENT DOCUMENTS

| JP | 8-227969 | 9/1996 |
| JP | 2000-353777 A | 12/2000 |
| JP | 3519227 | 4/2004 |
| JP | 2004-214452 | 7/2004 |
| JP | 2005-252305 | 9/2005 |
| JP | 3798184 | 7/2006 |
| JP | 2009-141000 A | 6/2009 |
| JP | 2009-213268 A | 9/2009 |
| JP | 2009-219273 | 9/2009 |
| KR | 10-2011-0020294 | 3/2011 |
| WO | WO 2010/004802 A1 | 1/2010 |
| WO | 2012/001805 A1 | 1/2012 |

OTHER PUBLICATIONS

Office Action issued Sep. 29, 2015 in Japanese Patent Application No. 2014-501983 (with English language translation).
Office Action issued May 12, 2015 in Japanese Patent Application No. 2014-175818 (with English language translation).
International Search Report issued Apr. 9, 2013, in PCT/JP2013/000137, filed Jan. 16, 2013.
Combined Office Action and Search Report issued Aug. 3, 2016 in Chinese Patent Application No. 201380011905.2 (with English translation and English translation of Categories of Cited Documents).
Office Action issued Oct. 27, 2016 in Korean Patent Application No. 10-2014-7024152 (with English language translation).

\* cited by examiner

POWER SEMICONDUCTOR MODULE AND POWER CONVERSION DEVICE

CROSS-REFERENCE TO RELATED APPLICATIONS

This application is a continuation which claims the benefit of priority under 35 U.S.C. §120 of U.S. application Ser. No. 14/381,339, filed Aug. 27, 2014, which is the National Stage of Application No. PCT/JP2013/000137, filed Jan. 16, 2013, which is based on the Japanese Priority Application No. 2012-045611 filed Mar. 1, 2012, the entire contents of each of which are hereby incorporated by reference.

TECHNICAL FIELD

The present invention relates to a technology for reducing the size and inductance of a power semiconductor module used for a power conversion device such as an inverter which is requested to be downsized.

BACKGROUND ART

In an insulated type power semiconductor module used for a power conversion device such as an inverter, a wiring pattern is formed over a metal plate, serving as a heat radiation plate, through an insulation layer, and a power semiconductor element that performs a switching operation is disposed on the wiring pattern. Such a power semiconductor element is connected to external terminals and is molded by resin. In a power conversion device in which a switching operation with large current and high voltage is performed, a surge voltage ($\Delta V = L \cdot di/dt$) is generated due to a time rate of current change di/dt when the power semiconductor element is switched off and a parasitic inductance L contained in the power conversion device, and the surge voltage is applied to the power semiconductor element. As the parasitic inductance L increases, a surge voltage larger than a breakdown voltage of the power semiconductor element may be generated and thus may cause destruction of the power semiconductor element. Therefore, reducing inductance is requested in power conversion devices and reducing inductance is requested also in power semiconductor modules.

A power semiconductor module has been developed in which a plurality of power semiconductor elements are arranged in parallel in a package and a plurality of external terminals are disposed, and in which terminals of the plurality of power semiconductor elements are each separately connected to the external terminal in the package (e.g., see Patent Document 1). Also, in the module shown in Patent Document 1, the external terminals through which principal current flows are disposed in a vertically-stacked manner and bonding wires are disposed so as to cancel magnetic fluxes generated by the principal current, thereby reducing the inductance.

PRIOR ART DOCUMENTS

Patent Documents

Patent Document 1: Patent Gazette No. JP3798184 (Page. 6, FIG. 8)

SUMMARY OF THE INVENTION

Problem that the Invention is to Solve

In a conventional power semiconductor module shown in Patent Document 1, two D1 terminals which are positive electrodes to be connected in parallel by an external bus bar are separately disposed with each other at two opposing sides of an exterior case, and similarly, two S2 terminals which are negative electrodes to be connected in parallel by an external bus bar are separately disposed with each other at the two opposing sides of the exterior case. Thus, the inductance of the external bus bar increases and there is a problem that a surge voltage may increase. In addition, since the D1 terminals which are the positive electrodes and the S2 terminals which are the negative electrodes are separately disposed and the inductance of the external bus bar increases, variation in inductance between a parallel circuit of the positive electrode side and a parallel circuit of the negative electrode side is likely to occur. The variation causes unbalance among values of current flowing through each of the power semiconductor elements, and there is another problem that a power cycle life of the power semiconductor module may be affected.

The module shown in Patent Document 1 is characterized in that S1/D2 terminals are disposed between the D1 terminals and the S2 terminals, and that the D1 terminals and the S2 terminals are separately-placed. In a two-level power conversion circuit in which a power semiconductor module configured to have an upper/lower arm in a package is frequently used in general, the power semiconductor module described in Patent Document 1 has large parasitic inductance in its commutation loop running from the positive electrode through the negative electrode and has a large surge voltage, and thus there is a problem that the destruction of the power semiconductor elements may occur. Also, in the module shown in Patent Document 1, the external terminals are stacked so as to reduce the parasitic inductance. However, since it is necessary to secure insulation between the stacked external terminals, the exterior case should work as an insertion case and have a complicated structure, and thus there is another problem that the cost thereof may increase.

When wire bonding to the external terminal having a bonding area is performed, bonding force is unlikely to be transmitted to a bonding portion due to insufficient strength at a portion where the external terminal is mounted to the exterior case, and thus a risk of weakened strength arises. In this case, when large current flows through the wire bond, large amount of heat is generated due to large resistance of the bonding portion and the wire bond is likely to be removed therefrom, and thus there is another problem that the power cycle life of the power semiconductor module may be shortened. Also, in the module shown in Patent Document 1, since the positive and negative electrodes of the front and rear surfaces of a power semiconductor element in the upper arm does not coincide with those in the lower arm, two types of power semiconductor elements are necessary, and thus there is another problem that the cost of the power semiconductor elements increases.

The present invention has been made in order to solve the above-described problems, and is to reduce inductance of a power semiconductor module without increasing the cost thereof and, in addition, to improve reliability of the power semiconductor module.

Means for Solving the Problem

A power semiconductor module according to the present invention includes an upper/lower arm that is configured by connecting self-arc-extinguishing type semiconductor elements in series; a positive electrode side DC terminal, a negative electrode side DC terminal, and an AC terminal that are connected to the upper/lower arm; and a wiring pattern that connects the self-arc-extinguishing type semiconductor elements of the upper/lower arm to the positive electrode side DC terminal, the negative electrode side DC terminal, and the AC terminal, wherein the upper/lower arm is plural in number; the positive electrode side DC terminal, the negative electrode side DC terminal, and the AC terminal are each disposed to be plural in number corresponding to the upper/lower arms; and the positive electrode side DC terminals and the negative electrode side DC terminals are closely disposed.

Advantageous Effects of the Invention

In a power semiconductor module according to the present invention, since a positive electrode side DC terminal, a negative electrode side DC terminal, and an AC terminal are each disposed to be plural in number corresponding to upper/lower arms, and the positive electrode side DC terminals and the negative electrode side DC terminals are closely disposed, variation in a connecting length to an external bus bar between the upper/lower arms is reduced, and variation in inductance between the upper/lower arms can be reduced. Also, variation in current caused by the variation in inductance can be reduced, thereby enabling equalization of current flowing through a power semiconductor element.

MODE FOR CARRYING OUT THE INVENTION

Embodiment 1

Figure 1:
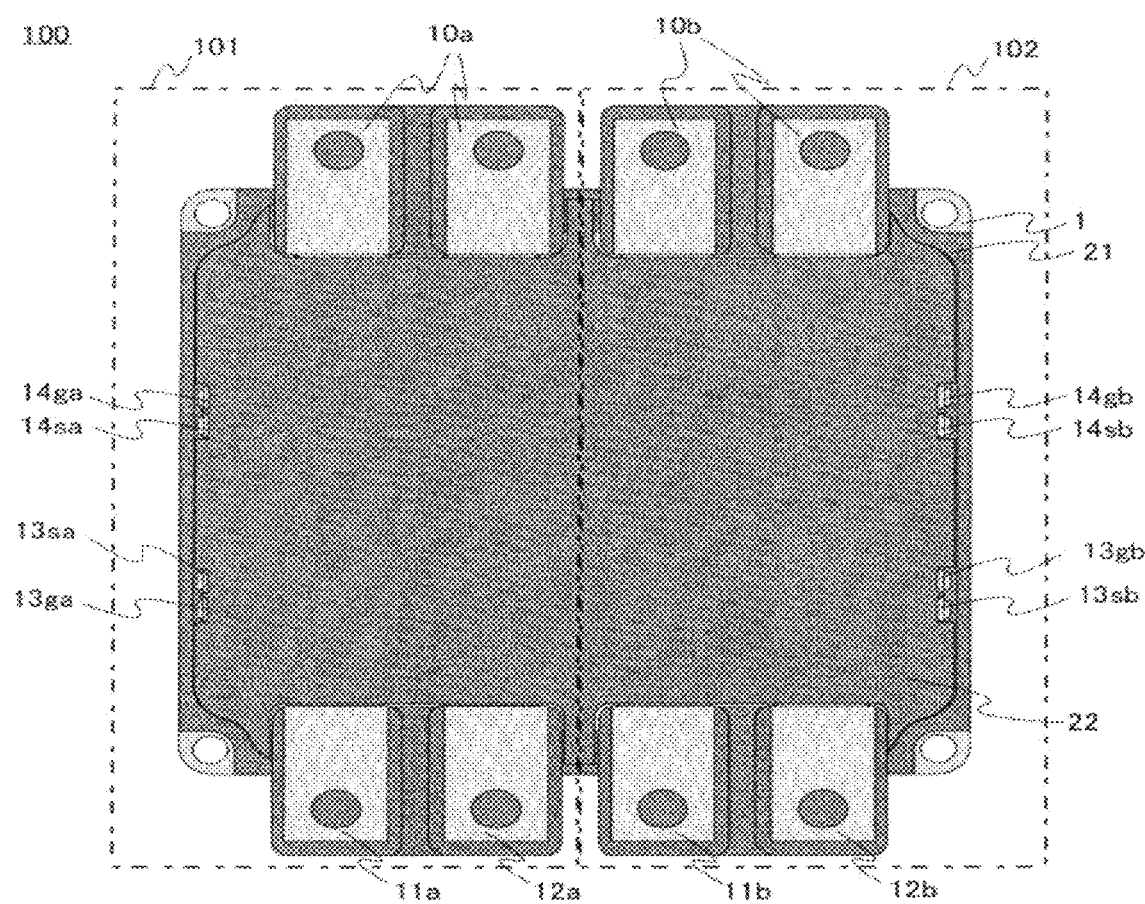
FIG. 1 is a top schematic diagram of a power semiconductor module according to Embodiment 1 of the present invention.
Figure 2:
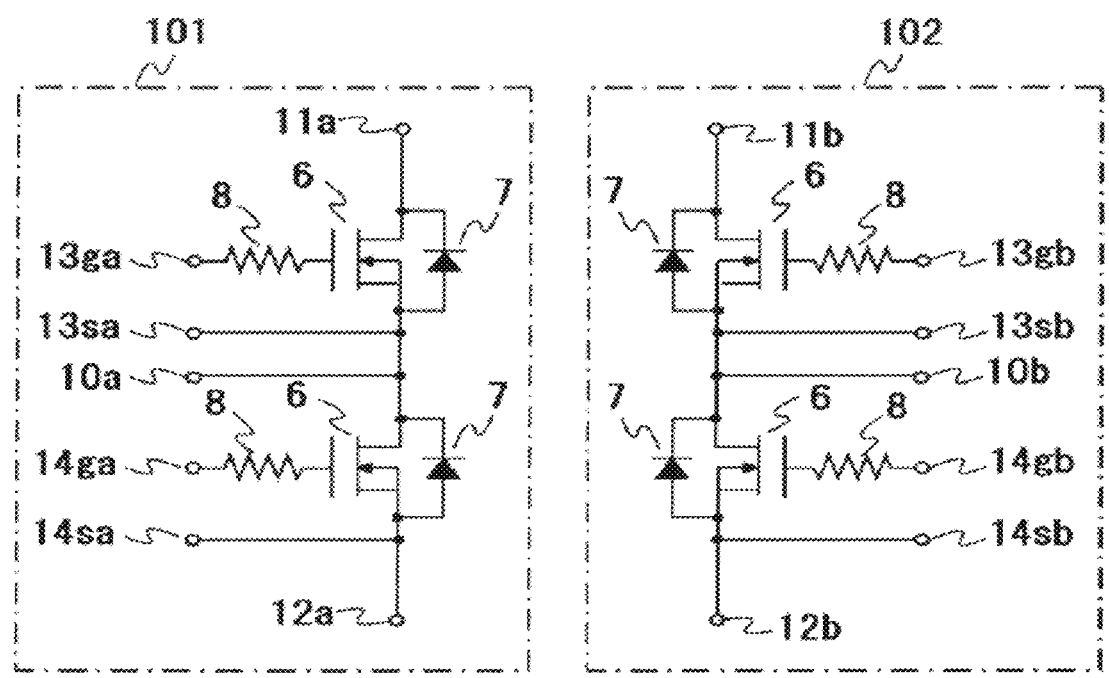
FIG. 2 is an equivalent circuit diagram of the power semiconductor module according to Embodiment 1 of the present invention.

FIG. 1 is a top schematic diagram of a power semiconductor module according to Embodiment 1 for embodying the present invention. FIG. 2 is an equivalent circuit diagram of the power semiconductor module. Referring to FIGS. 1 and 2, inside a power semiconductor module 100, two parallel circuits each called an arm, serving as a power semiconductor, in which a self-arc-extinguishing type semiconductor element 6 is anti-parallel-connected to a freewheeling diode 7, are connected in series, and configures an upper/lower arm corresponding to one phase of a power conversion circuit. When the power conversion circuit operates, principal current is defined by current flowing through the self-arc-extinguishing type semiconductor element 6 and the freewheeling diode 7 excluding current related to gate charging/discharging of the self-arc-extinguishing type semiconductor element 6. While a configuration is shown in Embodiment 1 in which a diode element such as a Schottky barrier diode serving as a freewheeling diode is externally mounted with respect to the self-arc-extinguishing type semiconductor element 6, a freewheeling diode may be a parasitic diode of the self-arc-extinguishing type semiconductor element 6.

The power semiconductor module 100 in Embodiment 1 is a power semiconductor module generally called as "two in one" in which the upper/lower arms are disposed together in a case 21 (together in a package). The case 21 serves as an outline of the power semiconductor module 100. While it is called as a case in Embodiment 1, in an instance in which an outline of a power semiconductor module is formed by resin molding, an outer circumferential portion of the resin serves as a case and performs an equivalent function. As shown in FIG. 1, the case 21 has a shape of a substantially rectangular parallelepiped while terminals hang over, and has a substantially quadrangular surface (surface at which terminals are disposed in FIG. 1). As shown in the equivalent circuit diagram in FIG. 2, the power semiconductor module 100 is divided into two circuit blocks 101, 102 each surrounded by a chain line. Each of the two circuit blocks 101, 102 configures the upper/lower arm, and positive electrode terminals 11*a*, 11*b* serving as positive electrode side DC terminals and negative electrode terminals 12*a*, 12*b* serving as negative electrode side DC terminals are disposed in the circuit blocks 101, 102, respectively. Hereinafter, the two circuit blocks may be called as A block 101 and B block 102.

The power semiconductor module 100 in Embodiment 1 is characterized in that the positive electrode terminal and the negative electrode terminal of the A block 101 are closely disposed to those of the B block 102. In a use case when the circuit blocks 101, 102 are connected in parallel by using external bus bars, since the positive electrode terminals 11a, 11b and the negative electrode terminals 12a, 12b are closely disposed, variation in the connecting length to the external bus bar between the circuit blocks 101, 102 is reduced. Thus, variation in inductance between the circuit blocks 101, 102 can be reduced and variation in current caused by the variation in inductance can be also reduced, thereby enabling current equalization in the power semiconductor module 100. In addition, while the power semiconductor module 100 is used as a power conversion device by connecting to the external bus bars, since the total length of the external bus bars is reduced, reduction of inductance in the power conversion device can be achieved.

Figure 3:
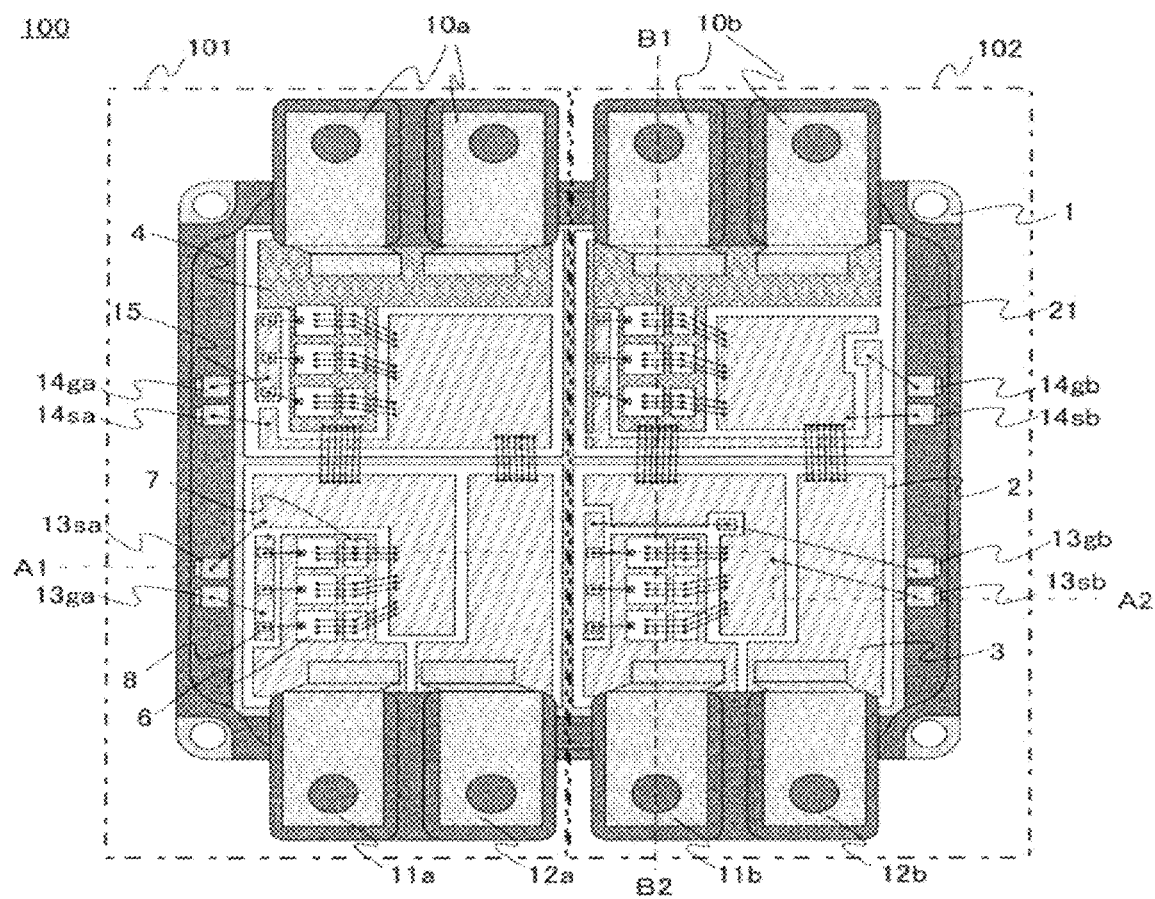
FIG. 3 is a top schematic diagram showing an inner structure of the power semiconductor module according to Embodiment 1 of the present invention.
Figure 4:
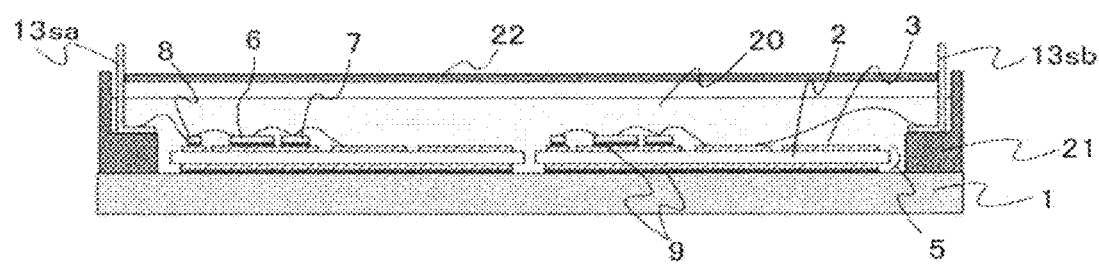
FIG. 4 is a cross-sectional schematic diagram at A1-A2 in FIG. 3.
Figure 5:
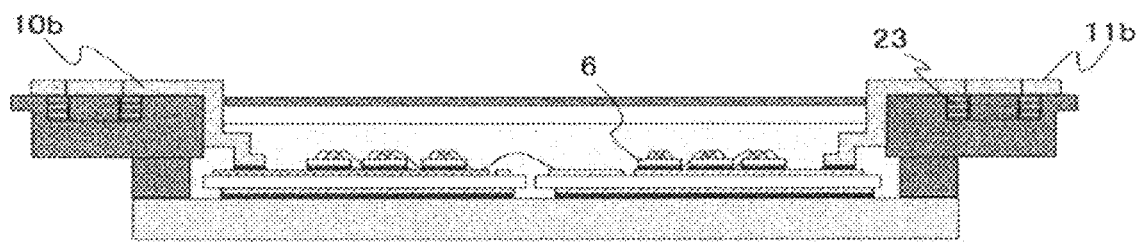
FIG. 5 is a cross-sectional schematic diagram at B1-B2 in FIG. 3.

FIG. 3 is a top schematic diagram showing an inner structure of the power semiconductor module 100 shown in FIG. 1. A cross-sectional schematic diagram at A1-A2 in FIG. 3 is shown in FIG. 4, and a cross-sectional schematic diagram at B1-B2 in FIG. 3 is shown in FIG. 5. In the power semiconductor module 100 in Embodiment 1, a ceramic insulation layer 2 which is an insulated substrate to which metallic foil is bonded by brazing etc., is bonded by solder 9 to a surface of one side of a base plate 1 which is a metal radiator for radiating heat generated by the self-arc-extinguishing type semiconductor elements 6 and the freewheeling diodes 7 which configure the power semiconductor module 100. On a surface, which is opposite to the surface bonded to the base plate 1, of the ceramic insulation layer 2, wiring patterns 3, 4 made of metallic foil are bonded by brazing etc. A ceramic insulation substrate 5 is configured with the ceramic insulation layer 2 to which the metallic foil is bonded, and the wiring patterns 3, 4.

On a surface, which is opposite to the surface bonded to the ceramic insulation layer 2, of the wiring patterns 3, 4, bonded by the solder 9 are the self-arc-extinguishing type semiconductor elements 6, the freewheeling diodes 7, chip resistors 8 each serving as a gate resistor of the self-arc-extinguishing type semiconductor element 6, AC terminals 10a, 10b, the positive electrode terminals 11a, 11b, and the negative electrode terminals 12a, 12b. Since large current flows through the AC terminals, positive electrode terminals, and negative electrode terminals, screws are generally used to connect them to an external circuit. Therefore, in Embodiment 1, holes for inserting screws are disposed in the AC terminals 10a, 10b, the positive electrode terminals 11a, 11b, and the negative electrode terminals 12a, 12b, and nuts 23 are embedded in the case 21 at portions to be contacted with the terminals from underneath.

In FIG. 3, the ceramic insulation layers 2, the wiring patterns 3, 4, and the A block 101 and B block 102 which are the upper/lower arms are housed in the case 21. One end of each of the positive electrode terminals 11a, 11b, the negative electrode terminals 12a, 12b, and the AC terminals 10a, 10b is connected to the wiring pattern 3 or to the wiring pattern 4, and the other end thereof is configured to be exposed to the surface of the case 21. The positive electrode terminals 11a, 11b, the negative electrode terminals 12a, 12b, and the AC terminals 10a, 10b are connected to the A block 101 and the B block 102, respectively, via the wiring pattern 3 or the wiring pattern 4. The positive electrode terminal (11a, 11b), the negative electrode terminal (12a, 12b), and the AC terminal (10a, 10b) are each disposed to be plural in number corresponding to the A block 101 and the B block 102 which are the circuit blocks.

In FIG. 3, the positive electrode terminals 11a, 11b and the negative electrode terminals 12a, 12b are disposed at a side of the substantially quadrangular surface of the case 21. That is, the positive electrode terminals 11a, 11b and the negative electrode terminals 12a, 12b are closely disposed. On the other hand, the AC terminals 10a, 10b are disposed at a side which is opposite to the side where the positive electrode terminals 11a, 11b and the negative electrode terminals 12a, 12b are disposed. An average distance between the positive electrode terminal 11a and the negative electrode terminal 12a and between the terminal 11b and the terminal 12b is shorter than an average distance between the positive electrode terminal 11a and the AC terminal 10a and between the terminal 11b and the terminal 10b. The positive electrode terminals 11a, 11b and the negative electrode terminals 12a, 12b are disposed alternately, and are arranged in the order of the positive electrode terminal 11a, negative electrode terminal 12a, positive electrode terminal 11b, and negative electrode terminal 12b.

A surface of the self-arc-extinguishing type semiconductor element 6 without the solder bonding and a surface of the freewheeling diode 7 without the solder bonding are bonded to the wiring patterns 3, 4 etc. by wire bonds 15. A surface of the chip resistor 8 without the solder bonding is bonded to a gate electrode of the self-arc-extinguishing type semiconductor element 6 by the wire bond 15. The case 21 is bonded on the base plate 1 by an adhesive etc., and a molding resin 20 is injected into the case 21 in order to insulate the inside of the power semiconductor module 100. And then, a lid 22 is fitted and bonded to the case 21 by an adhesive etc., thereby obtaining the power semiconductor module 100 shown in FIG. 1.

While the divided ceramic insulation substrate 5 is employed for each arm, which is configured with the self-arc-extinguishing type semiconductor elements 6 and the freewheeling diodes 7, in the power semiconductor module 100 shown in FIG. 3, the ceramic insulation substrate is not necessarily to be divided. As the number of elements such as the self-arc-extinguishing type semiconductor elements 6 and the freewheeling diodes 7 disposed in the power semiconductor module 100 varies on the basis of a current capacity of the power semiconductor module 100, if one ceramic insulation substrate 5 is employed when the number of elements is large, the size of the ceramic insulation substrate 5 becomes large. In this case, a reliability problem occurs such as generation of cracks in the ceramic insulation substrate caused by the difference of the coefficient of thermal expansion between the substrate and a structural member of the power semiconductor module 100, i.e. the base plate 1, the solder 9, and so on. Therefore, when the number of elements is large, it may be helpful to consider the division of the ceramic insulation substrate 5 depending on the current capacity.

Figure 6:
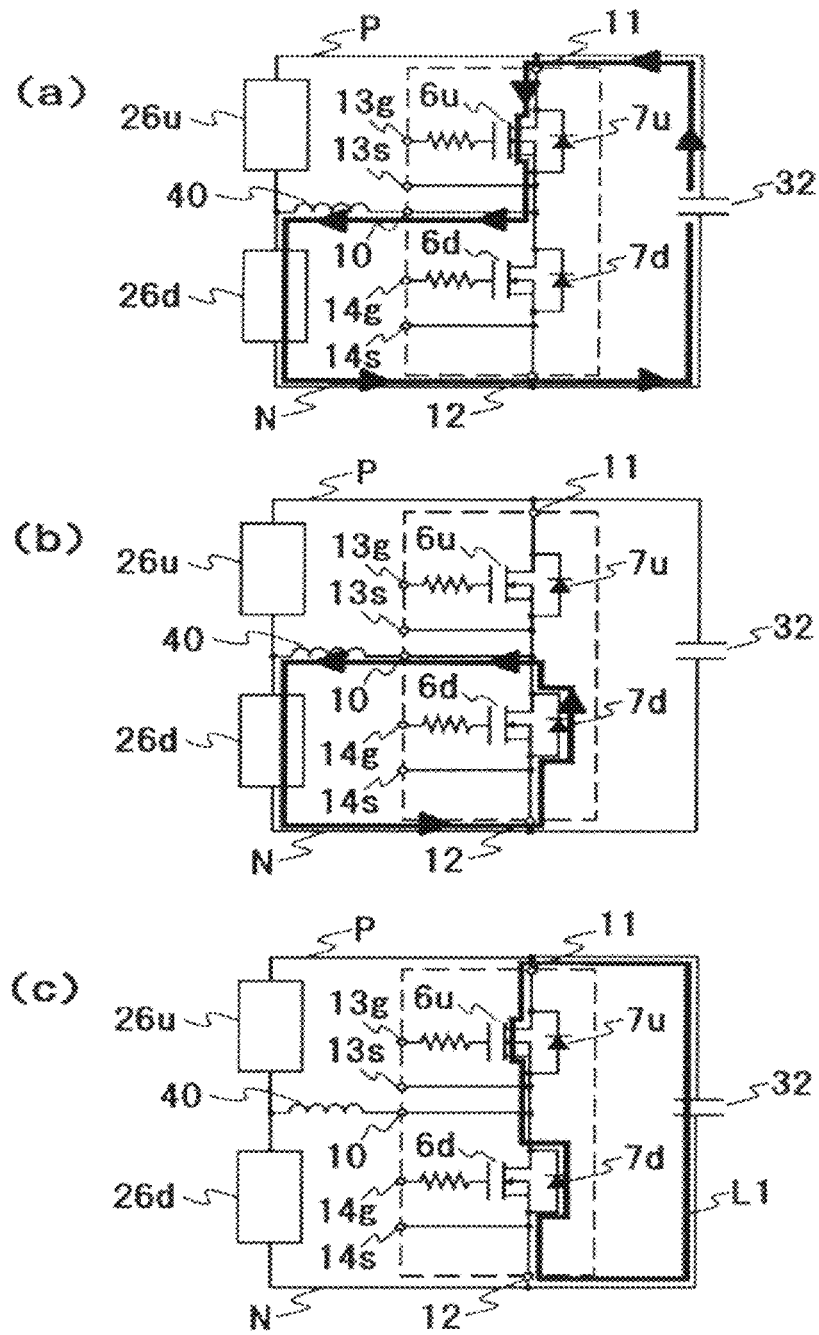
FIG. 6 is a switching operation circuit diagram of an upper arm self-arc-extinguishing type semiconductor element in a two-level circuit according to Embodiment 1 of the present invention.

Next, a switching operation in a two-level circuit using a power semiconductor module of a two in one type will be described. FIG. 6 is a switching operation circuit diagram of an upper arm self-arc-extinguishing type semiconductor element in a two-level circuit. Referring to the operation circuit diagram shown in FIG. 6, by taking a case as an example in which a MOSFET (Metal-Oxide-Semiconductor Field-Effect Transistor) is employed as a self-arc-extinguishing type semiconductor element, a switching mode of the MOSFET of the upper arm (positive electrode side) will be described.

As shown in (a) in FIG. 6, both ends of a capacitor 32 are connected between a positive side DC bus line P and a negative side DC bus line N. The positive electrode terminal 11 of the power semiconductor module 100 is connected to the positive side DC bus line P and the negative electrode terminal 12 thereof is connected to the negative side DC bus line N, thereby configuring a two-level circuit. A portion surrounded by a broken line in (a) in FIG. 6 shows the power semiconductor module 100, and white circles show external terminals exposed to the surface of the power semiconductor module 100, such as the AC terminal 10, positive electrode terminal 11, and negative electrode terminal 12. In FIG. 6, a current path when switching a positive electrode side MOSFET 6u is shown superposably on the circuit by arrows.

In (a) in FIG. 6, when the positive electrode side MOSFET 6u is ON, the current from the positive electrode of the capacitor 32 flows through the positive electrode side MOSFET 6u, the AC terminal 10, and a negative electrode arm 26d of another phase via a load 40 such as a motor, and then flows into the negative electrode of the capacitor 32. Since an inductance component effects on a load when switching the MOSFET, the load 40 is represented as the inductance in FIG. 6. On the other hand, when the positive electrode side MOSFET 6u is switched from ON to OFF, the current flowing through the load 40 is refluxed to a negative electrode side freewheeling diode 7d, as shown in (b) in FIG. 6. Therefore, a commutation loop L1 when turning off the positive electrode side MOSFET 6u is shown as a loop starting from the positive electrode of the capacitor 32, running through the positive electrode side MOSFET 6u and the negative electrode side freewheeling diode 7d, and returning to the negative electrode of the capacitor 32, as shown in (c) in FIG. 6. Note that, while only the MOSFETs, freewheeling diodes, and capacitors are shown in FIG. 6, inductance and resistance components of wirings for connecting the semiconductors with each other are actually included in the circuit, and the parasitic inductance and resistance components are included in the commutation loop L1.

When a negative electrode side MOSFET 6d is switched, similar to the above description, a commutation loop is shown as a loop starting from the positive electrode of the capacitor 32, running through a positive electrode side freewheeling diode 7u and the negative electrode side MOSFET 6d, and returning to the negative electrode of the capacitor 32. As described above, a surge voltage applied when the self-arc-extinguishing type semiconductor element 6 is turned off is proportional to inductance Ls of a commutation loop. Therefore, it is necessary in a two-level circuit to reduce the inductance of the commutation loop L1 described in (c) in FIG. 6. Inductance factors of a commutation loop can be divided into three components, i.e. inductance of a bus bar for connecting between the power semiconductor module and the capacitor, inductance of the capacitor itself, and parasitic inductance inside of the power semiconductor module. The present invention relates to the reduction of the third one, i.e. the parasitic inductance inside of the power semiconductor module.

Figure 7:
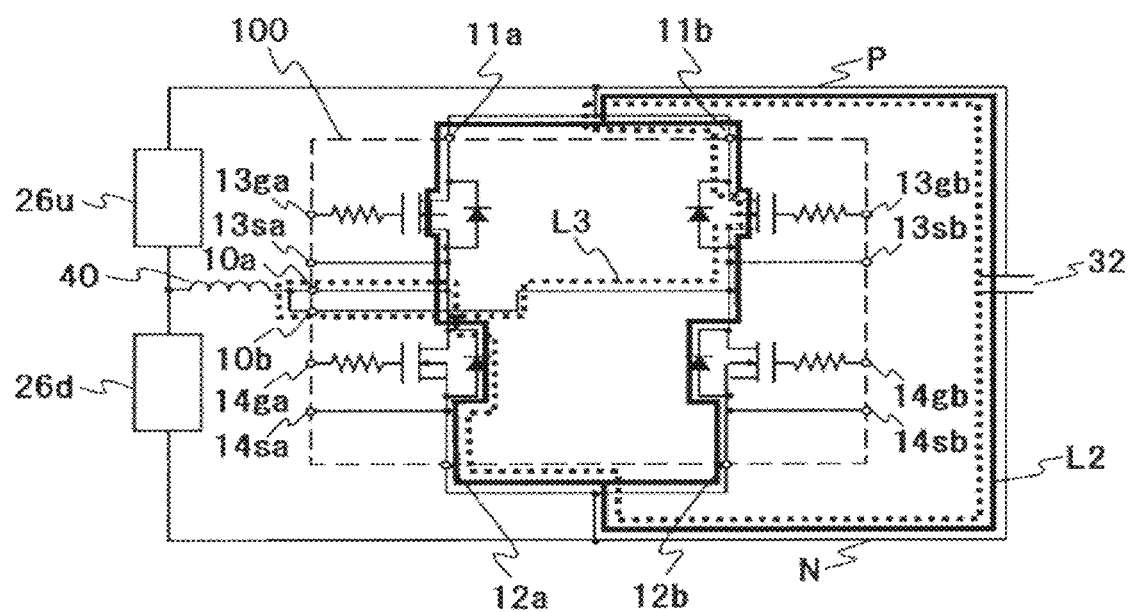
FIG. 7 is a circuit diagram showing a commutation loop at a switching operation of the upper arm self-arc-extinguishing type semiconductor element in the two-level circuit according to Embodiment 1 of the present invention.

FIG. 7 is a circuit diagram showing a commutation loop L2 at a switching operation of the upper arm self-arc-extinguishing type semiconductor element in the two-level circuit. In the power semiconductor module 100 in Embodiment 1, two circuit blocks of the upper/lower arms are disposed inside of the module. Thus, two paths corresponding to the two circuit blocks are generated shown as the commutation loop L2 indicated by a solid line in FIG. 7, and inductance can be reduced compared to that for one circuit block. Here, a path running through the AC terminals 10a, 10b, indicated by a dotted line, is a commutation loop L3.

The power semiconductor module 100 in Embodiment 1 is characterized in that the positive electrode terminals and the negative electrode terminals are arranged alternately on a side of the case 21, in the order of the positive electrode terminal 11a, negative electrode terminal 12a, positive electrode terminal 11b, and negative electrode terminal 12b. As described above, by connecting the bus bar, the circuit blocks 101, 102 are connected in parallel, and inductance of the power semiconductor module 100 is reduced. As to inductance of terminal portions, since the direction of current flowing through the positive electrode terminals 11a, 11b is opposite to the direction of current flowing through the negative electrode terminals 12a, 12b, inductance of the positive electrode terminals 11a, 11b and the negative electrode terminals 12a, 12b can be further reduced by alternately arranging the positive electrode terminals 11a, 11b and the negative electrode terminals 12a, 12b. If the positive electrode terminals 11a, 11b and negative electrode terminals 12a, 12b are disposed separately from the AC terminals 10a, 10b, the external bus bars can be connected easily and a control driver circuit board on which a control driver circuit is mounted can be disposed between the terminals, thereby enabling downsizing of the power conversion device. Here, the AC terminals 10a, 10b are disposed at a side which is opposite to the side where the positive electrode terminals 11a, 11b and negative electrode terminals 12a, 12b are disposed. The number of AC terminals may be set according to current capacity, and four terminals are disposed in Embodiment 1.

Control terminals 13, 14 (positive electrode gate control terminals 13ga, 13gb; negative electrode gate control terminals 14ga, 14gb; positive electrode source control terminals 13sa, 13sb; negative electrode source control terminals 14sa, 14sb) of the self-arc-extinguishing type semiconductor element 6 of the upper/lower arm are separately disposed for each of the circuit blocks 101, 102, and are arranged at the remaining two sides of the surface of the case 21. In the wiring pattern 3, wiring pattern portions connected to the control terminals 13, 14 of the circuit blocks 101, 102 are called as control wiring pattern portions for descriptive purposes. The control wiring pattern portions are divided into a positive electrode gate control wiring pattern portion, a negative electrode gate control wiring pattern portion, a positive electrode source control wiring pattern portion, and a negative electrode source control wiring pattern portion. In Embodiment 1, each control electrode of the self-arc-extinguishing type semiconductor element 6 of each of the circuit blocks 101, 102 is connected to each control wiring pattern portion, and each control wiring pattern portion of each of the circuit blocks 101, 102 is connected to each of the control terminals 13, 14 which are disposed at the surface of the case 21 for each of the circuit blocks 101, 102. Since the control terminals 13, 14 are disposed for each of the circuit blocks, it is not necessary to connect the control wiring pattern portions inside of the case 21, thereby enabling downsizing of the module.

Figure 8:
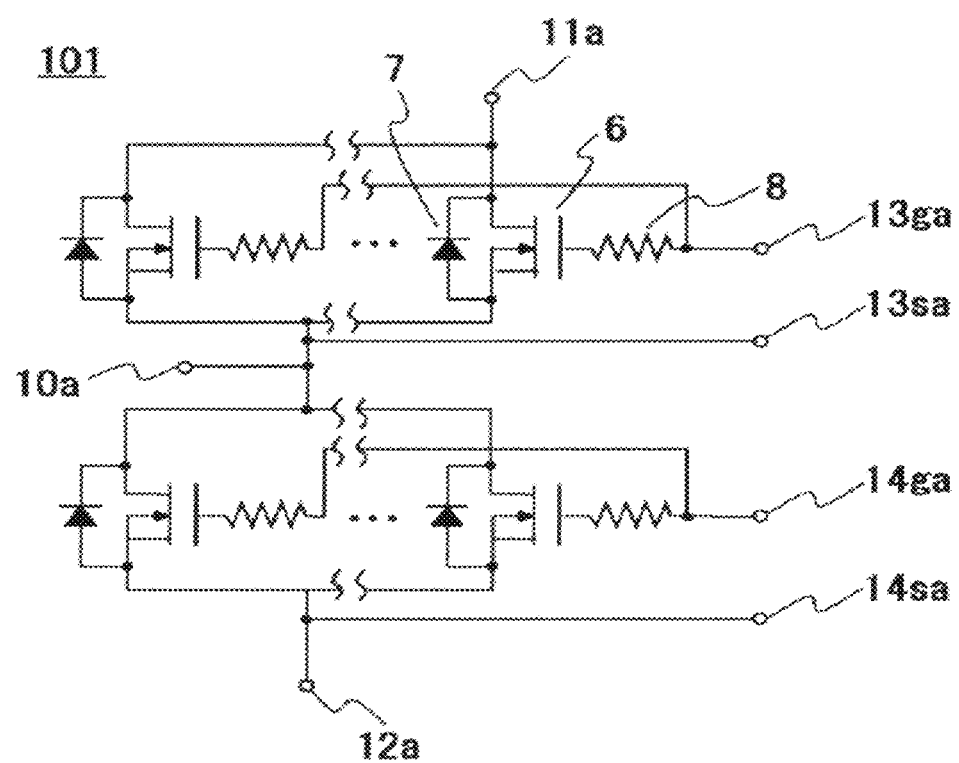
FIG. 8 is an equivalent circuit diagram of an A-block of the power semiconductor module according to Embodiment 1 of the present invention.

While the self-arc-extinguishing type semiconductor elements 6 or the freewheeling diodes 7 connected in parallel in one circuit block are collectively represented as one element or one diode in FIG. 2, there may be actually a case in which the self-arc-extinguishing type semiconductor elements 6 or the freewheeling diodes 7 are connected in parallel in one circuit block, as shown in the equivalent circuit diagram of the A block 101 in FIG. 8. While FIG. 8 shows the equivalent circuit diagram of the A block 101, the same will apply to the B block 102. However, a plurality of self-arc-extinguishing type semiconductor elements 6 or a plurality of freewheeling diodes 7 are not necessarily to be connected in parallel, and the effect of the present invention can be obtained as long as each circuit block is configured with the self-arc-extinguishing type semiconductor element 6 and the freewheeling diode 7. While the self-arc-extinguishing type semiconductor element 6 is described as a MOSFET in Embodiment 1, the effect of the present invention can be obtained even if other self-arc-extinguishing type semiconductor element such as an IGBT (Insulated Gate Bipolar Transistor) and a bipolar transistor is employed.

Figure 9:
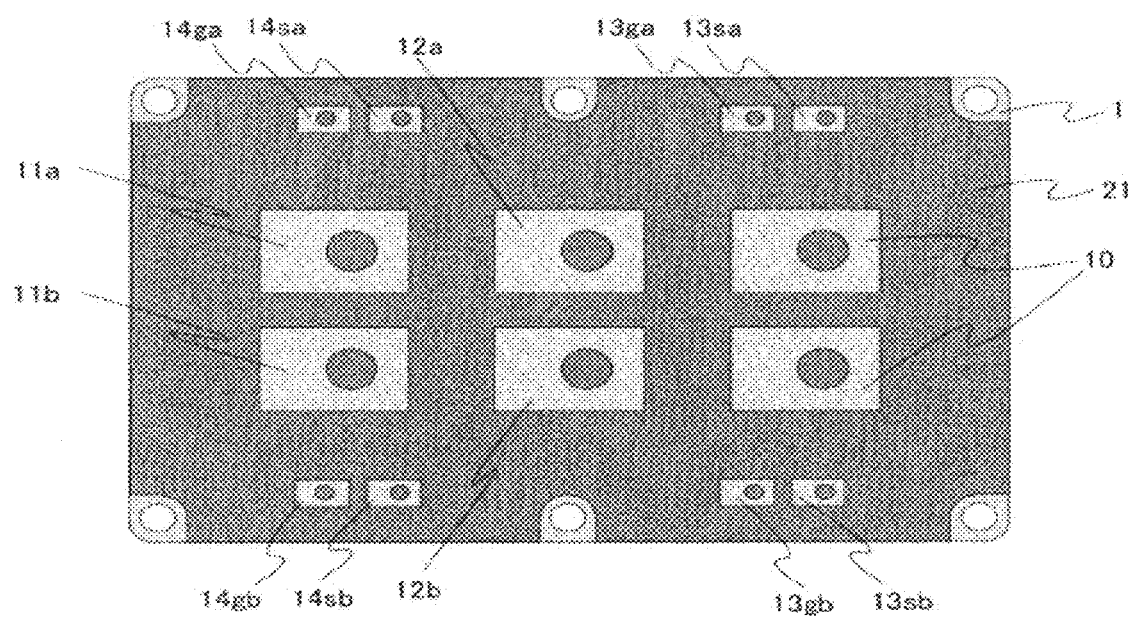
FIG. 9 is a top schematic diagram of another power semiconductor module according to Embodiment 1 of the present invention.
Figure 10:
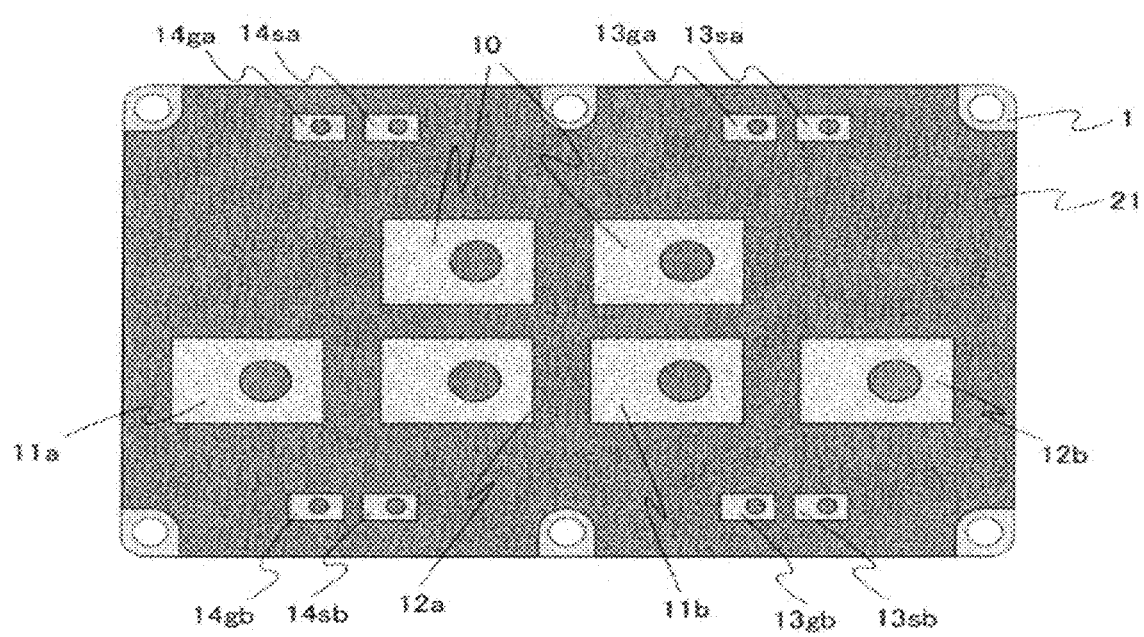
FIG. 10 is a top schematic diagram of another power semiconductor module according to Embodiment 1 of the present invention.

Each of FIGS. 9 and 10 is a top schematic diagram of another power semiconductor module. As shown in FIGS. 9 and 10, terminals are arranged so that the positive electrode terminals 11a, 11b of a circuit block and the negative electrode terminals 12a, 12b of another circuit block are closely disposed on the substantially quadrangular surface of the case 21. In this way, the effect of the present invention can be obtained as long as the positive electrode terminals 11a, 11b and the negative electrode terminals 12a, 12b are closely disposed, and the present invention should not be limited to the case where the positive electrode terminals 11a, 11b and the negative electrode terminals 12a, 12b are disposed at any one side of the case 21, shown as the power semiconductor module 100 in FIG. 1. The effect of the present invention can be obtained even if the AC terminals 10 are disposed separately from the positive electrode terminals 11a, 11b and negative electrode terminals 12a, 12b. If the positive electrode terminals 11a, 11b and negative electrode terminals 12a, 12b are disposed separately from the AC terminals 10a, 10b, the external bus bars can be connected easily and a control driver circuit board on which a control driver circuit is mounted can be disposed between the terminals, thereby enabling downsizing of the power conversion device.

While the power semiconductor module 100 in which two blocks of A block 101 and B block 102 are disposed in parallel is described in Embodiment 1, the effect of the present invention can be obtained if the number of circuit blocks to be disposed in parallel is two or more.

As described above, since the positive electrode terminal (11a, 11b) the negative electrode terminal (12a, 12b), and the AC terminal (10a, 10b) are each disposed to be plural in number corresponding to the circuit blocks (upper/lower arms) 101, 102, and the positive electrode terminals 11a, 11b and the negative electrode terminals 12a, 12b are closely disposed, variation in the connecting length to the external bus bar between the circuit blocks 101, 102 is reduced, and variation in inductance between the circuit blocks 101, 102 can be reduced. Also, variation in current caused by the variation in inductance can be reduced, thereby enabling equalization of current flowing through the power semiconductor module 100. In addition, while the power semiconductor module 100 is used as a power conversion device by connecting to the external bus bars, since the total length of the external bus bars is reduced, reduction of inductance in the power conversion device can be achieved. Furthermore, since a plurality of circuit blocks each configuring the upper/lower arm are disposed, inductance of the power semiconductor module can be reduced. Still further, since the power semiconductor module 100 in Embodiment 1 does not need a complicated case and can use the same constituents as those for a conventional power semiconductor module, inductance of the power semiconductor module can be reduced without increasing the cost thereof and, in addition, reliability of the power semiconductor module can be improved.

Embodiment 2

Figure 11:
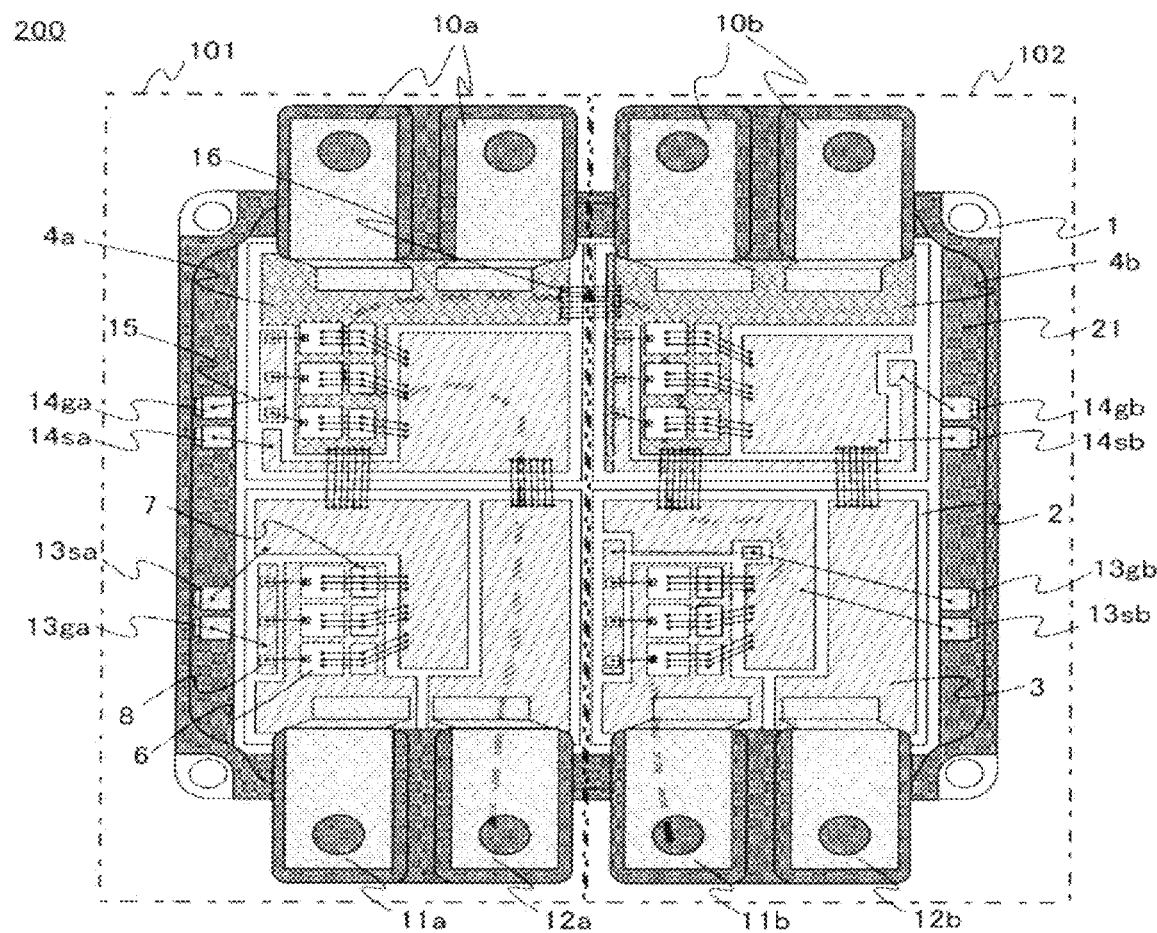
FIG. 11 is a top schematic diagram showing an inner structure of a power semiconductor module according to Embodiment 2 of the present invention.

FIG. 11 is a top schematic diagram showing an inner structure of a power semiconductor module according to Embodiment 2 for embodying the present invention. The power semiconductor module 200 in Embodiment 2 has a path through which principal current flows and structural members almost the same as those of the power semiconductor module 100 in Embodiment 1. What makes Embodiment 2 different from Embodiment 1 is that the wiring pattern 4 of the circuit block 101, to which the AC terminals 10a, and the self-arc-extinguishing type semiconductor elements 6 and freewheeling diodes 7 of the lower arm are bonded, is electrically connected to the wiring pattern 4 of the circuit block 102, to which the AC terminals 10b and those of the lower arm are bonded, by a wire bond 16 so as to have the same potential.

From among the wiring patters 3, 4, wiring patterns connected to the AC terminals 10a, 10b of the circuit blocks 101, 102 are called as AC terminal pattern portions 4a, 4b, respectively, for descriptive purposes. In Embodiment 2, the AC terminal pattern portion 4a of the A block 101 is electrically connected to the AC terminal pattern portion 4b of the B block 102 by the wire bond 16 inside of the case 21 so as to have the same potential.

Figure 12:
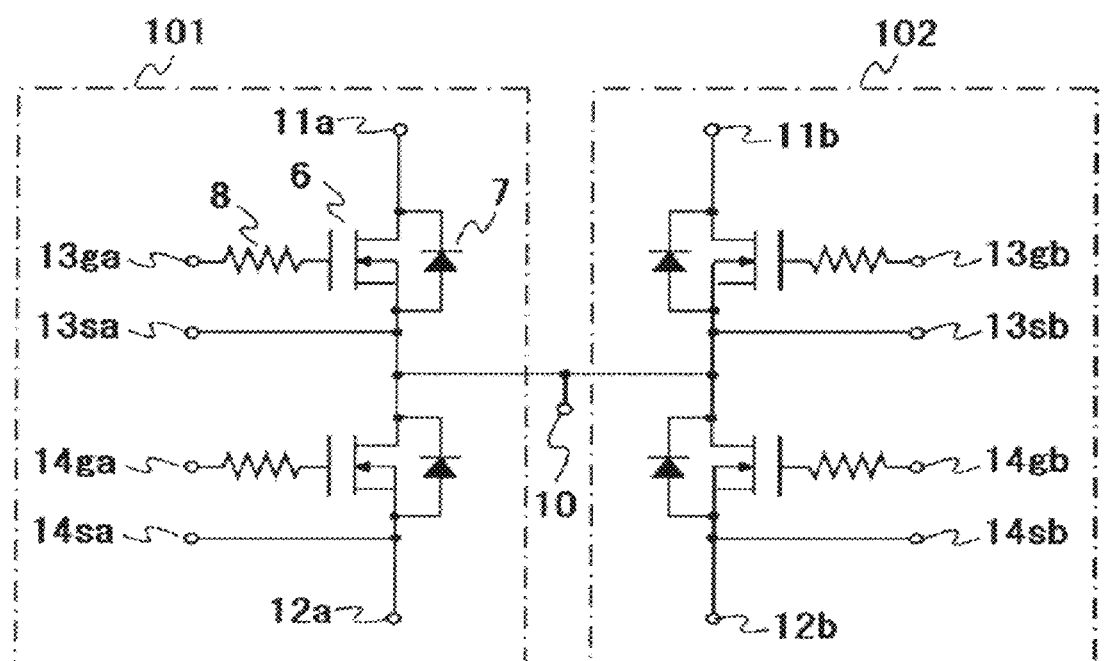
FIG. 12 is an equivalent circuit diagram of the power semiconductor module according to Embodiment 2 of the present invention.

FIG. 12 is an equivalent circuit diagram of the power semiconductor module 200 in Embodiment 2. The power semiconductor module 200 in Embodiment 2 is characterized in, similar to that in Embodiment 1, that the positive electrode terminal 11a and the negative electrode terminal 12a of the A block 101 are closely disposed to the positive electrode terminal 11b and the negative electrode terminal 12b of the B block 102. In a use case when the circuit blocks 101, 102 are connected in parallel by using external bus bars, since the positive electrode terminals 11a, 11b and the negative electrode terminals 12a, 12b are closely disposed, variation in the connecting length to the external bus bar between the circuit blocks is reduced. Thus, variation in inductance between the circuit blocks can be reduced and variation in current caused by the variation in inductance can be also reduced, thereby enabling equalization of current flowing through the power semiconductor module 200. In addition, while the power semiconductor module 200 is used as a power conversion device by connecting to the external bus bars, since the total length of the external bus bars is reduced, reduction of inductance in the power conversion device can be achieved.

Figure 13:
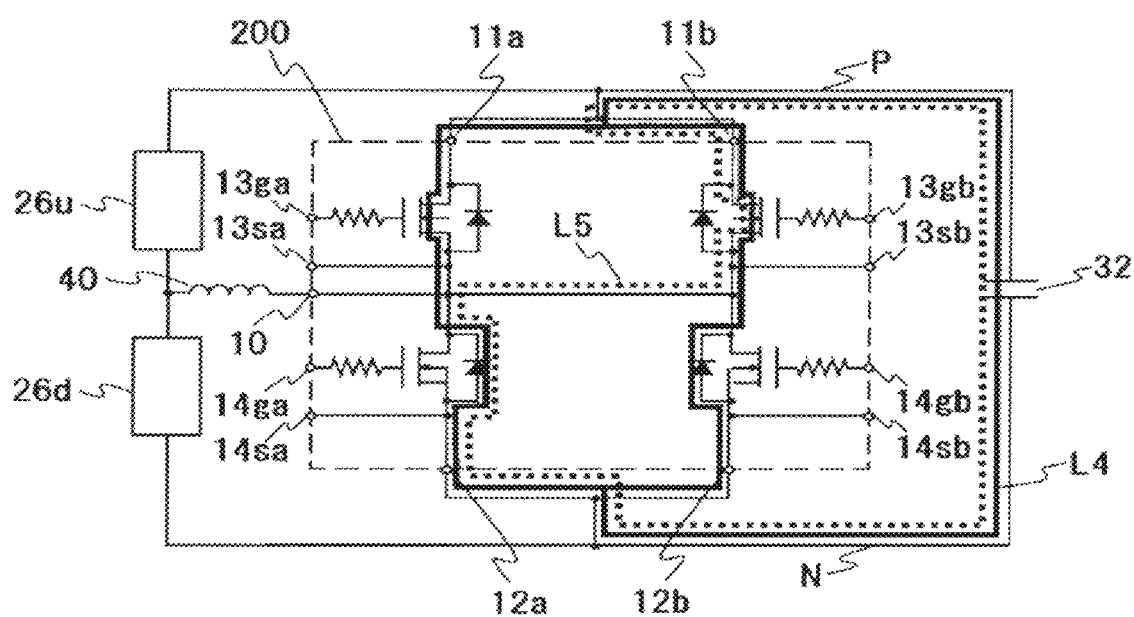
FIG. 13 is a circuit diagram showing a commutation loop at a switching operation of an upper arm self-arc-extinguishing type semiconductor element in a two-level circuit according to Embodiment 2 of the present invention.

FIG. 13 is a circuit diagram showing a commutation loop L4 at a switching operation of an upper arm self-arc-extinguishing type semiconductor element in a two-level circuit. In the power semiconductor module 200 in Embodiment 2, two circuit blocks of the upper/lower arms are disposed inside of the module. Thus, two paths corresponding to the two circuit blocks are generated shown as the commutation loop L4 indicated by a solid line in FIG. 13, and inductance can be reduced compared to that for one circuit block. The AC terminal pattern portion 4a of one circuit block, to which the AC terminals 10, and the self-arc-extinguishing type semiconductor elements 6 and freewheeling diodes 7 of the lower arm are bonded, is electrically connected to the AC terminal pattern portion 4b of the other circuit block, to which those are bonded, by the wire bond 16. Thus, a path indicated by a dotted line in FIG. 13 is a commutation loop L5. The power semiconductor module 200 in Embodiment 2 is characterized in that the two circuit blocks are electrically connected inside of the power semiconductor module. Since they are connected inside of the power semiconductor module 200, the commutation loop L5 becomes small by not running through the AC terminals 10 as shown in FIG. 7, and inductance of the commutation loop L5 (path indicated by dotted line in FIGS. 11, 13) which runs from the positive electrode terminal 11*b* to the negative electrode terminal 12*a* becomes small. In the commutation loop L5 which runs from the positive electrode terminal 11*b* to the negative electrode terminal 12*a*, a path in which current flows in the opposite direction is disposed along the loop, thereby enabling further reduction of inductance of the commutation loop. The reason is that the wiring pattern 4 close to the positive electrode terminal 11*b* and the negative electrode terminal 12*a* can be disposed along the loop. This is because the wiring pattern 3 and the wiring pattern 4, each of which corresponds to a path where principal current of the circuit block flows, have the relationship of substantially parallel translation, between the two circuit blocks, along the side of the case 21 where the positive electrode terminals 11*a*, 11*b* and the negative electrode terminals 12*a*, 12*b* are disposed. In this way, not only achieving reduction of inductance by disposing the two circuit blocks, but also achieving further reduction of inductance by electrically connecting the circuit blocks 101, 102 are enabled.

On the other hand, if the AC terminals 10*a*, 10*b* are connected outside of the module using the external bus bars as shown in the power semiconductor module 100, since inductance of the AC terminals themselves is large, inductance of the commutation loop L3, indicated by the dotted line in FIG. 7, which runs through the AC terminals is larger than inductance of the commutation loop L2 indicated by the solid line in FIG. 7. As a result, since the inductance of the commutation loop L2 indicated by the solid line in FIG. 7 dominates, reduction of inductance is small and the effect equal to that of the power semiconductor module 200 in Embodiment 2 cannot be obtained.

While the case is described in Embodiment 2 where the electrical connection between the two circuit blocks so as to have the same potential is made by the wire bond 16, the effect of the present invention can be obtained by employing any other method as long as an electrical connection for having the same potential is enabled. Also, while the power semiconductor module 200 in which two blocks of A block 101 and B block 102 are disposed in parallel is described in Embodiment 2, the effect of the present invention can be obtained if the number of circuit blocks to be disposed in parallel is two or more.

As described above, since the wiring pattern 4 of the circuit block 101, to which the AC terminals 10*a* are bonded, is electrically connected to the wiring pattern 4 of the circuit block 102, to which the AC terminals 10*b* are connected, by the wire bond 16 so as to have the same potential, the commutation loop becomes small and inductance of the commutation loop which runs from the positive electrode terminal 11*b* to the negative electrode terminal 12*a* can be further reduced.

Embodiment 3

Figure 14:
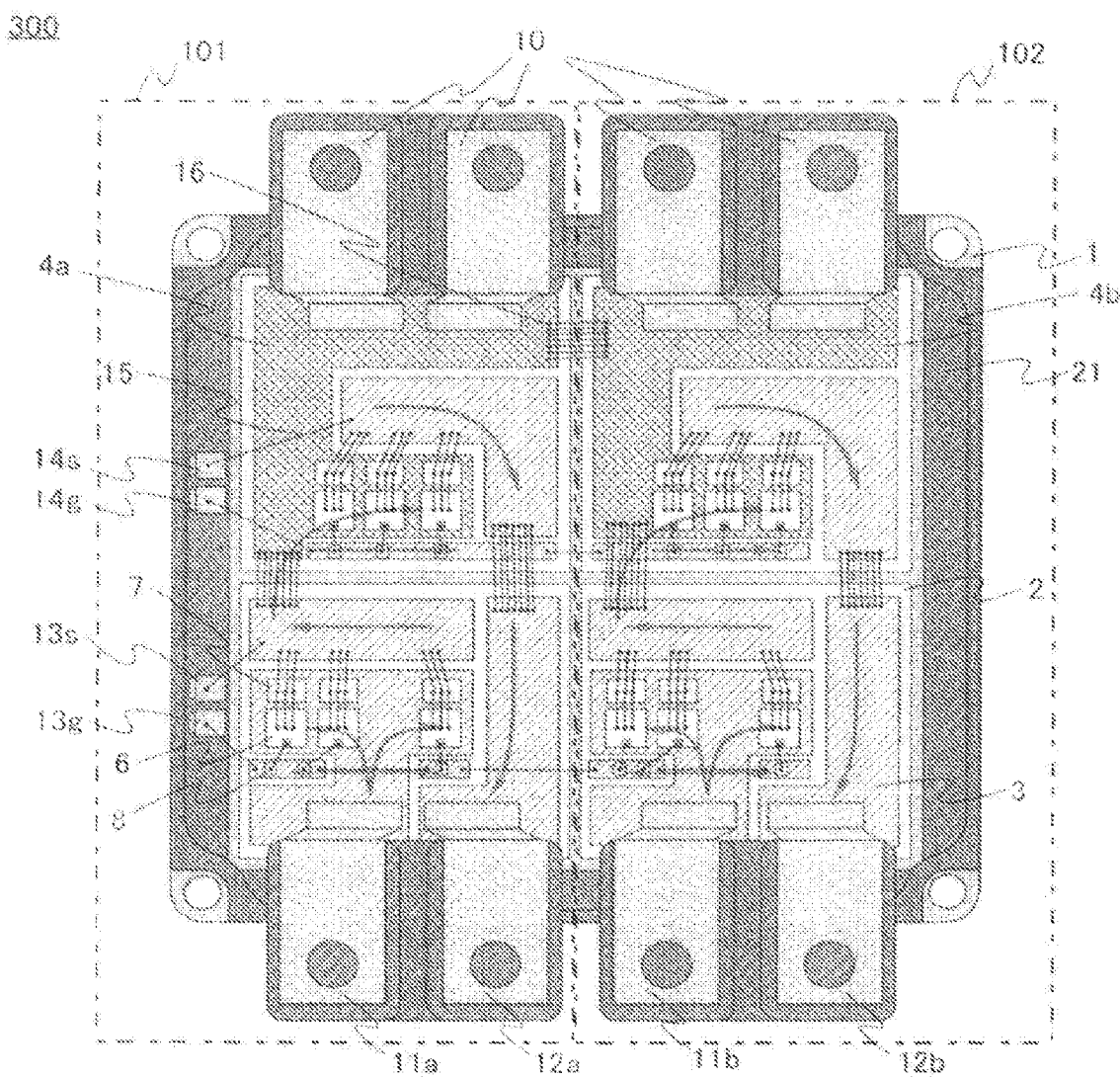
FIG. 14 is a top schematic diagram showing an inner structure of a power semiconductor module according to Embodiment 3 of the present invention.

FIG. 14 is a top schematic diagram showing an inner structure of a power semiconductor module according to Embodiment 3 for embodying the present invention. The power semiconductor module 300 in Embodiment 3 has a path through which principal current flows and structural members almost the same as those of the power semiconductor module 200 in Embodiment 2. What makes Embodiment 3 different from Embodiment 2 is that, while a set of control terminals (positive/negative electrode gate control terminals and positive/negative electrode source control terminals) of the upper/lower arm is disposed for each of the circuit blocks in the power semiconductor module 200 in Embodiment 2, control terminals for the self-arc-extinguishing type semiconductor elements 6 for each circuit block are commonly used between the circuit blocks in the power semiconductor module 300 in Embodiment 3.

Control terminals 13, 14 (positive electrode gate control terminal 13*g*, negative electrode gate control terminal 14*g*, positive electrode source control terminal 13*s*, negative electrode source control terminal 14*s*) of the self-arc-extinguishing type semiconductor elements 6 of the upper/lower arm are commonly used between the circuit blocks 101, 102, and are disposed at a side of the surface of the case 21. In the wiring pattern 3, wiring pattern portions connected to the control terminals 13, 14 of the circuit blocks 101, 102 are called as control wiring pattern portions for descriptive purposes. The control wiring pattern portions are divided into a positive electrode gate control wiring pattern portion, a negative electrode gate control wiring pattern portion, a positive electrode source control wiring pattern portion, and a negative electrode source control wiring pattern portion. In Embodiment 3, each control electrode of the self-arc-extinguishing type semiconductor elements 6 of each of the circuit blocks 101, 102 are connected to each control wiring pattern portion, and each control wiring pattern portion of the circuit block 101 is electrically connected to the corresponding control wiring pattern portion of the circuit block 102 by a wire bond inside of the case 21 so as to have the same potential. Each of the control wiring pattern portions which are electrically connected so as to have the same potential is connected to each of the control terminals 13, 14 which are disposed at the side of the surface of the case 21. That is, from among the control wiring pattern portions, one control wiring pattern portion is connected to each of the control terminals 13, 14.

The power semiconductor module 300 in Embodiment 3 is characterized in, similar to that in Embodiment 1, that the positive electrode terminal and the negative electrode terminal of the A block 101 are closely disposed to the positive electrode terminal and the negative electrode terminal of the B block 102. In a use case when the circuit blocks 101, 102 are connected in parallel by using external bus bars, since the positive electrode terminals and the negative electrode terminals are closely disposed, variation in the connecting length to the external bus bar between the circuit blocks is reduced. Thus, variation in inductance between the circuit blocks can be reduced and variation in current caused by the variation in inductance can be also reduced, thereby enabling equalization of current flowing through the power semiconductor module 300. In addition, while the power semiconductor module 300 is used as a power conversion device by connecting to the external bus bars, since the total length of the external bus bars is reduced, reduction of inductance in the power conversion device can be achieved.

The wiring pattern 4 of one circuit block is electrically connected to the wiring pattern 4 of the other circuit block by the wire bond 16, and the wiring pattern 3 and the wiring pattern 4, each of which corresponds to a path where principal current of the circuit block flows, have the relationship of substantially parallel translation along the side of the case 21 where the positive electrode terminals and the negative electrode terminals are disposed. Therefore, similar to Embodiment 2, inductance of the power semiconductor module 300 can be reduced.

In the power semiconductor module 300 in Embodiment 3, the gate control wiring pattern portion of the self-arc-extinguishing type semiconductor elements 6 of one circuit block is electrically connected to that of the other circuit block. This generates a relationship of parallel translation in main circuits, and thus the module 300 is characterized in that a relationship between the direction of the principal current indicated by arrows in FIG. 14 and the direction of gate charge/discharge current of the self-arc-extinguishing type semiconductor elements 6 is unified for all the circuit blocks. That is, the relationship between the direction of the gate charge/discharge current, flowing through the control wiring pattern portion, of the self-arc-extinguishing type semiconductor elements 6 and the direction of the principal current flowing through the self-arc-extinguishing type semiconductor elements 6 is the same for the circuit block 101 and the circuit block 102 which are the upper/lower arms. Electromagnetic induction caused by the principal current generates electromotive force in gate charge/discharge paths such as the gate control wiring pattern portion of the self-arc-extinguishing type semiconductor elements 6 and the wire bond 15. Therefore, by unifying the direction of the principal current and the direction of the gate charge/discharge current of the self-arc-extinguishing type semiconductor elements 6 between the circuit blocks, inductance of the principal current to the gate of the self-arc-extinguishing type semiconductor elements 6 can be unified for each circuit block, and thus current unbalance between the circuit blocks can be reduced.

As described above, since the control terminals 13, 14 of the self-arc-extinguishing type semiconductor elements 6 of the circuit blocks 101, 102 are commonly used between the circuit blocks 101, 102, inductance of the principal current with respect to the self-arc-extinguishing type semiconductor elements 6 can be unified between the circuit blocks 101, 102, and thus current unbalance can be reduced.

Embodiment 4

Figure 15:
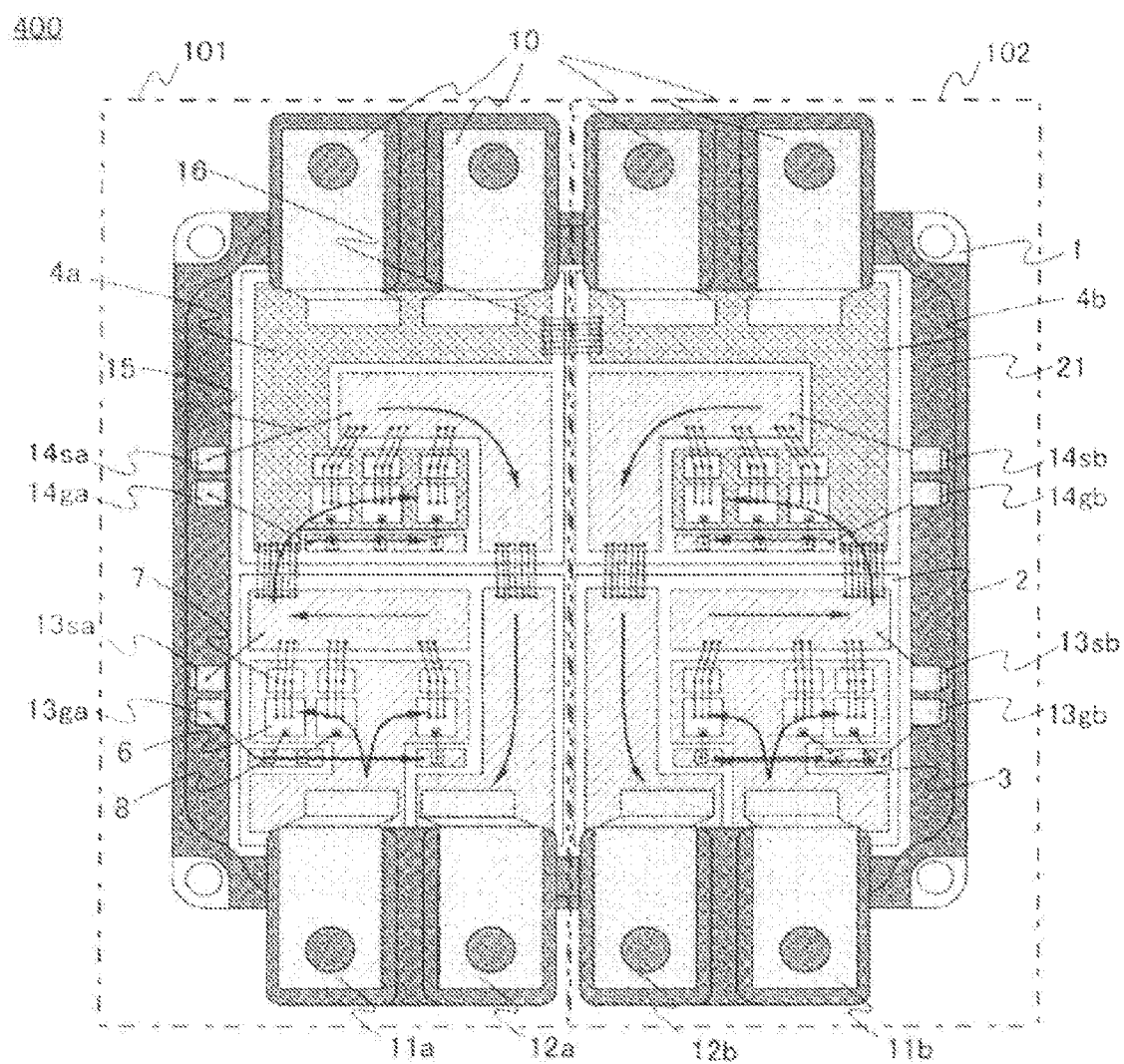
FIG. 15 is a top schematic diagram showing an inner structure of a power semiconductor module according to Embodiment 4 of the present invention.

FIG. 15 is a top schematic diagram showing an inner structure of a power semiconductor module according to Embodiment 4 for embodying the present invention. The power semiconductor module 400 in Embodiment 4 has a path through which principal current flows and structural members almost the same as those of the power semiconductor module 200 in Embodiment 2. What makes Embodiment 4 different from Embodiment 2 is that, while the A block 101 and the B block 102 are disposed so as to have the relationship of substantially parallel translation in the power semiconductor module 200 in Embodiment 2, the A block 101 and the B block 102 are disposed so as to have a relationship of substantially mirror symmetry in the power semiconductor module 400 in Embodiment 4. The wiring patterns 3, 4, and the self-arc-extinguishing type semiconductor elements 6 and the freewheeling diodes 7 which are disposed for each of the circuit blocks 101, 102, in one block are arranged in the opposite direction with respect to those in the neighboring block. By employing such an arrangement, current flowing through the wire bond 15 for connecting the wiring patterns 3, 4 to the self-arc-extinguishing type semiconductor elements 6 and the freewheeling diodes 7 in the one block has the opposite direction with respect to that in the neighboring block.

Similar to Embodiment 2, in the power semiconductor module 400 in Embodiment 4, since the AC terminals 10, i.e. the wiring pattern to which the semiconductor elements of the lower arm are bonded, of one circuit is electrically connected to those of the other circuit, a commutation loop which runs from the positive electrode terminal of the one circuit to the negative electrode terminal of the other circuit is generated. Therefore, inductance can be further reduced. Since the A block 101 and the B block 102 are disposed so as to have a relationship of substantially mirror symmetry, the direction of the principal current and the direction of the gate charge/discharge current of the self-arc-extinguishing type semiconductor elements 6 can be unified for each of the circuit blocks while the control terminals 13, 14 are disposed for each of the circuit blocks, and thus current unbalance between the circuit blocks can be reduced. Note that the number of the circuit blocks should not be limited to two and the substantially mirror symmetry can be obtained if the number is equal to two times n (where n is natural number). Here, in a case where no wire bond 16 in FIG. 15 is disposed, in which the AC terminals 10, i.e. the wiring pattern to which the semiconductor elements of the lower arm are bonded, of one circuit is not electrically connected to those of the other circuit, or in a case where the control terminals of the A block 101 and the B block 102, which are arranged in mirror symmetry with each other, are commonly used between the blocks, the effect equal to that in Embodiment 1 can be obtained. Therefore, electrically connecting the AC terminals 10, i.e. the wiring pattern to which the semiconductor elements of the lower arm are bonded, of one circuit to those of the other circuit, or disposing control terminals for each of the circuit blocks is not a restriction. When the A block 101 and the B block 102 are arranged in mirror symmetry with each other, inductance can be reduced by closely arranging the positive electrode terminals 11a, 11b and the negative electrode terminals 12a, 12b.

As described above, since the wiring patterns 3, 4, and the self-arc-extinguishing type semiconductor elements 6 and the freewheeling diodes 7 which are disposed for each of the circuit blocks 101, 102, are arranged in mirror symmetry with each other between the neighboring blocks, the direction of the principal current and the direction of the gate charge/discharge current can be unified for each of the circuit blocks, and thus current unbalance between the circuit blocks can be reduced.

Embodiment 5

Figure 16:
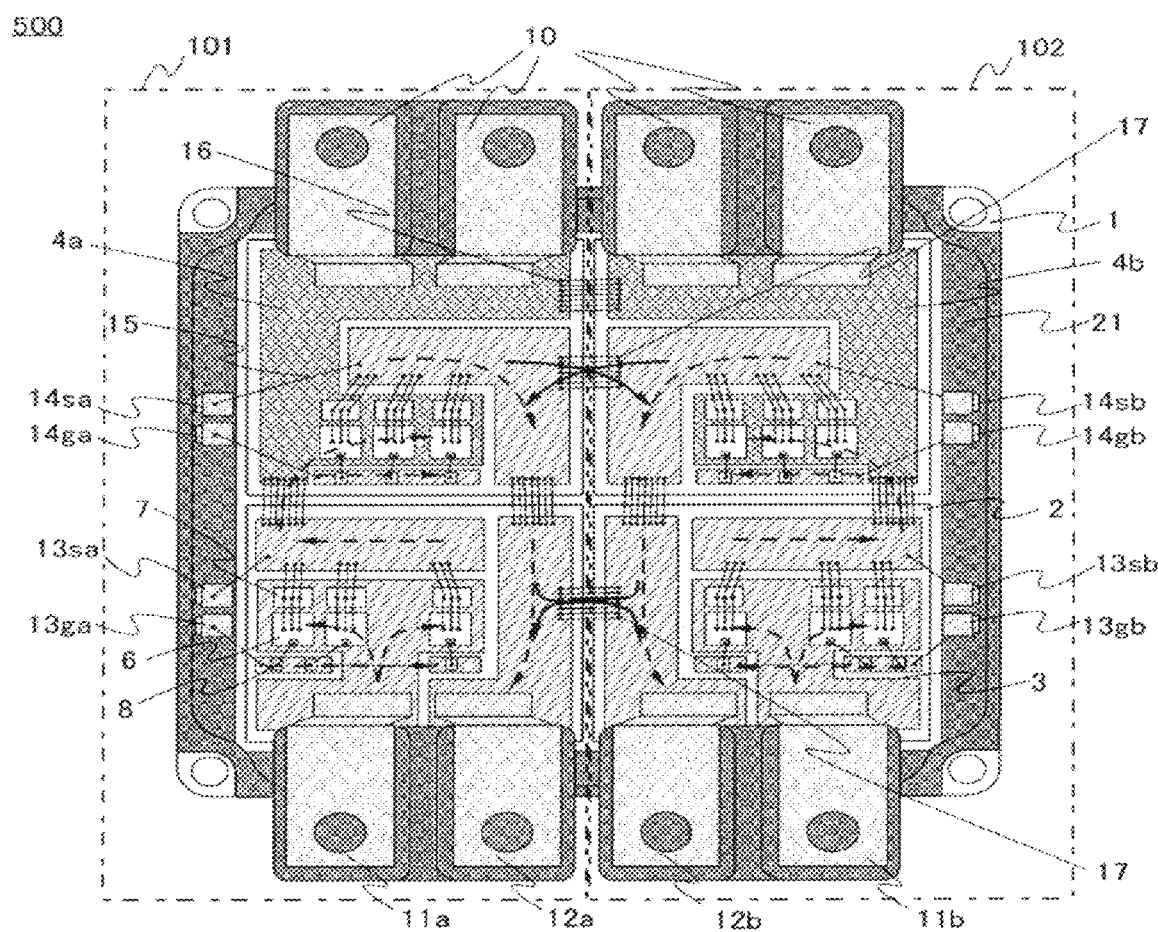
FIG. 16 is a top schematic diagram showing an inner structure of a power semiconductor module according to Embodiment 5 of the present invention.

FIG. 16 is a top schematic diagram showing an inner structure of a power semiconductor module according to Embodiment 5 for embodying the present invention. The power semiconductor module 500 in Embodiment 5 has the inner structure almost the same as that of the power semiconductor module 400 in Embodiment 4. What makes Embodiment 5 different from Embodiment 4 is that, while the wiring pattern 3 of the circuit block 101, to which the negative electrode terminals are connected, is not electrically connected to the wiring pattern 3 of the circuit block 102, to which those are connected, by a wire bond etc., the wiring patterns 3 are electrically connected with each other by a wire bond 17 in the power semiconductor module in Embodiment 5. The wiring pattern 3 of one lower arm and that of the other lower arm are electrically connected with each other by the wire bond 17 so as to have the same potential. By connecting the wiring patterns 3 with each other in this way, a current path indicated by a solid line in FIG. 16 is generated (dotted line is current path shown in Embodiment 4).

Figure 17:
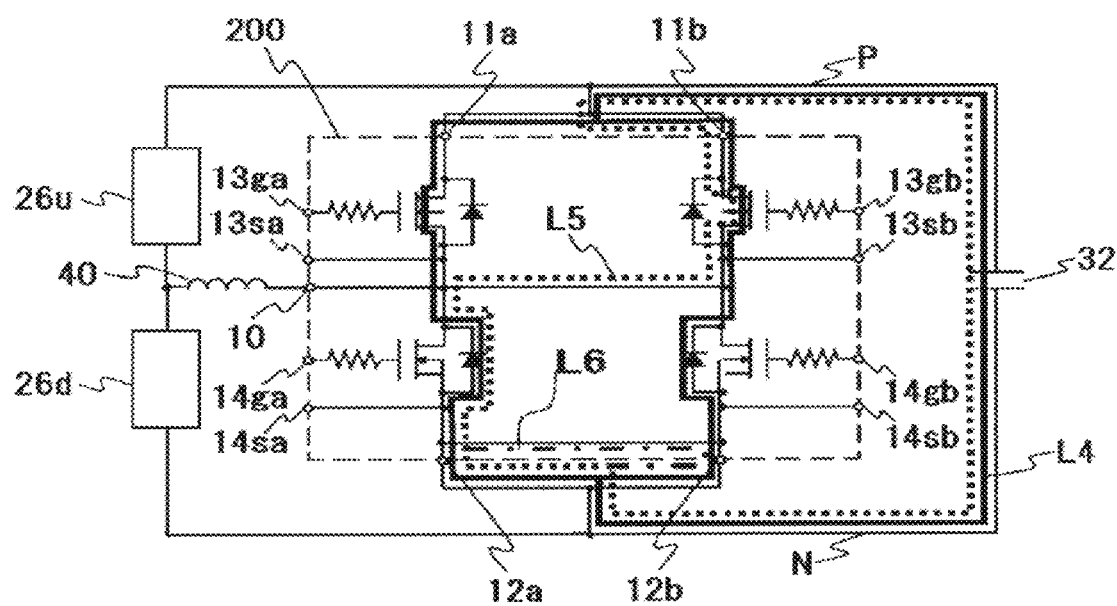
FIG. 17 is a circuit diagram showing a commutation loop at a switching operation of an upper arm self-arc-extinguishing type semiconductor element in a two-level circuit according to Embodiment 5 of the present invention.

FIG. 17 is a circuit diagram showing a commutation loop at a switching operation of an upper arm self-arc-extinguishing type semiconductor element in a two-level circuit. In the power semiconductor module 500 in Embodiment 5, two circuit blocks of the upper/lower arms are disposed in the module. While there are the commutation loops L4, L5 in the power semiconductor module 400 in Embodiment 4, a commutation loop L6 is added in Embodiment 5 by connecting the wiring patterns 3 with each other and it is found that the number of the commutation loops increases. Since an inductance value of a commutation loop has a tendency to decrease as the number of current paths increases, inductance can be further reduced in the power semiconductor module 500 in Embodiment 5 compared to that in the power semiconductor module 400 in Embodiment 4. Note that, while the two wire bonds 17 for electrically connecting the wiring patterns 3 with each other are disposed in FIG. 16, the number thereof is not necessarily to be two, and the effect of the present invention can be obtained even if only either one of the two wire bonds is disposed.

While the case is described in Embodiment 5 where the electrical connection between the two circuit blocks so as to have the same potential is made by the wire bond 17, the effect of the present invention can be obtained by employing any other method as long as an electrical connection for having the same potential is enabled. Also, while the power semiconductor module 500 in which two blocks of A block 101 and B block 102 are disposed in parallel is described in Embodiment 5, the effect of the present invention can be obtained even if the number of circuit blocks to be disposed in parallel is two or more.

As described above, since the wiring pattern 3 of the lower arm of the circuit block 101, connected to the negative electrode terminal 12a, and the wiring pattern 3 of the lower arm of the circuit block 102, connected to the negative electrode terminal 12b, are electrically connected with each other by the wire bond 17 so as to have the same potential, the number of current paths in the commutation loop increases and inductance of the commutation loop running toward the negative electrode terminals 12a, 12b can be reduced.

While the power semiconductor module is described in the power conversion device in Embodiment 5 in which the A block 101 and the B block 102 are disposed so as to have the relationship of substantially mirror symmetry, the effect of the present invention can be obtained even if the power semiconductor module is employed in which the A block 101 and the B block 102 are disposed so as to have the relationship of substantially parallel translation as shown in the power semiconductor modules 100, 200, and 300 in Embodiments 1 through 3.

Embodiment 6

Figure 18:
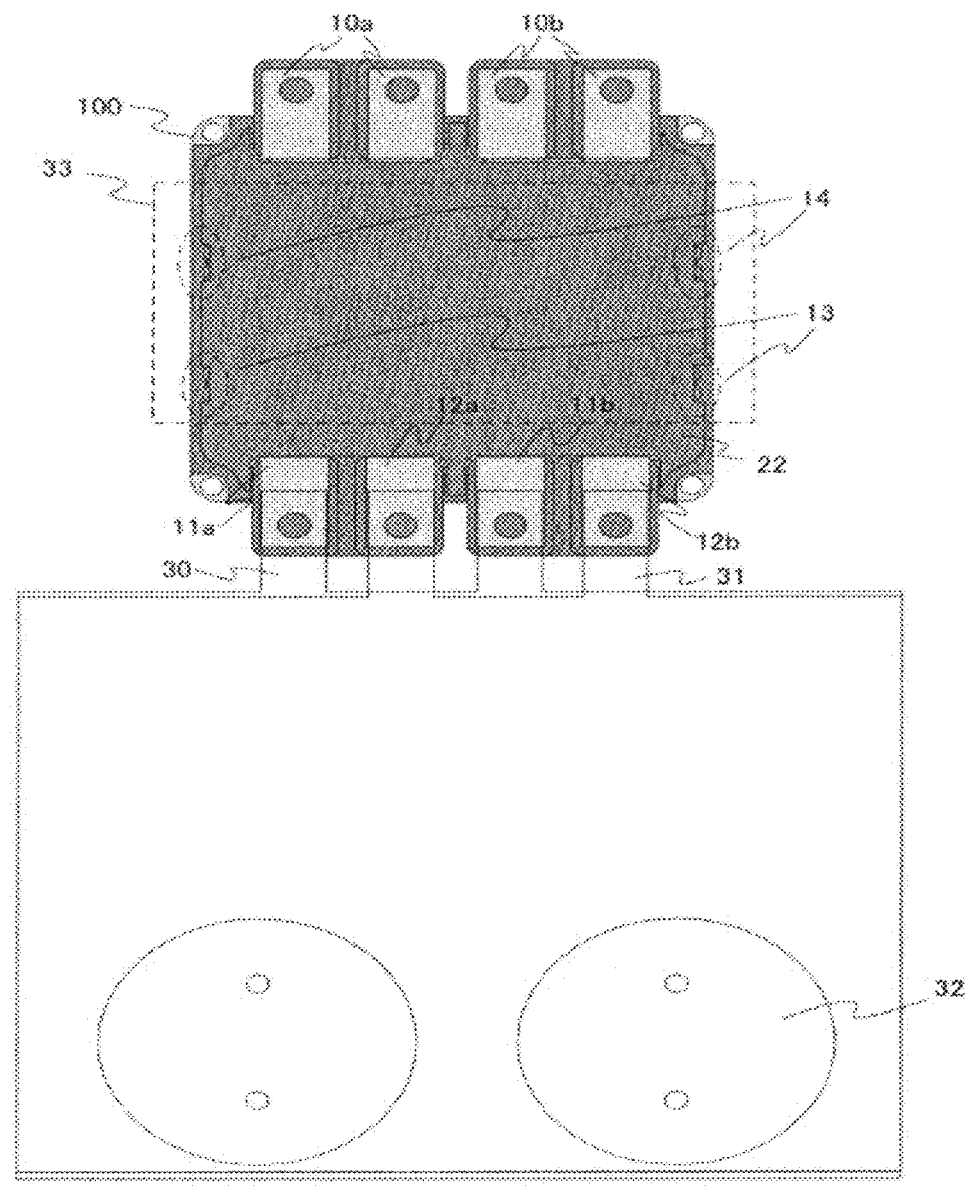
FIG. 18 is a top schematic diagram of a power conversion device according to Embodiment 6 of the present invention.
Figure 19:
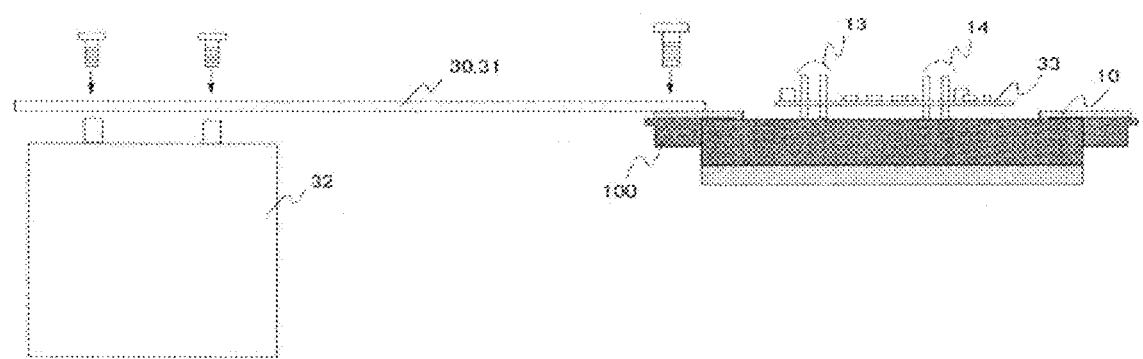
FIG. 19 is a cross-sectional schematic diagram of FIG. 18.

FIG. 18 is a top schematic diagram of a power conversion device according to Embodiment 6 for embodying the present invention. FIG. 19 is a cross-sectional schematic diagram of FIG. 18. The power semiconductor module 100 shown in FIG. 18 is the power semiconductor module described in Embodiment 1. While the power semiconductor module 100 is illustrated in FIG. 18 so as to configure one phase of an inverter, the inverter is actually configured with three phases and three power semiconductor modules are needed at the minimum. In general, the positive electrode terminals 11a, 11b of the power semiconductor module 100 for each of the three phases are electrically connected by a positive electrode bus bar 30, and the negative electrode terminals 12a, 12b thereof are electrically connected by a negative electrode external bus bar 31.

As described in Embodiment 1, in the power semiconductor module 100, the positive electrode terminals 11a, 11b and negative electrode terminals 12a, 12b, and the AC terminals 10a, 10b are disposed at two opposing sides. Therefore, since a free space is generated at an upper portion of the power semiconductor module 100, there can be disposed a control driver circuit board 33 on which a control driver circuit for controlling the self-arc-extinguishing type semiconductor elements 6 of the power semiconductor module 100 is mounted. That is, the control driver circuit board 33 is disposed over the surface of the power semiconductor module 100. Since the control terminals 13, 14 are pin-type ones in the power semiconductor module 100, it may be helpful to use the control driver circuit board 33 in which through holes are provided so that the control terminals 13, 14 can be solder bonded thereto. However, this is not a limitation, and the effect of the present invention can be obtained even if other connecting methods are employed as long as the control driver circuit board can be disposed over the power semiconductor module 100. In the power semiconductor module 100 in which control terminals are disposed for each of the circuit blocks, the control terminals of each block are connected with each other by using a driver circuit board or a wiring.

If the control driver circuit board can be disposed over the power semiconductor module 100, a short distance from the control terminals 13, 14 decreases the effect of noise and thus malfunction of the self-arc-extinguishing type semiconductor elements 6 is less likely to happen, thereby preventing failure of the power semiconductor module 100. Also, since a dead space can be utilized, downsizing of the power conversion device is enabled. While the power semiconductor module 100 described in Embodiment 1 is used to describe the power conversion device in Embodiment 6, the effect of the present invention can be obtained even if the power semiconductor modules 200, 300, 400, and 500 in Embodiments 2 through 5 are used.

In all Embodiments, the self-arc-extinguishing type semiconductor element and the freewheeling diode may be made of a wide bandgap semiconductor which has a large bandgap compared to silicon. Silicon carbide, gallium nitride based material, and diamond are examples of the wide bandgap semiconductor. Since the self-arc-extinguishing type semiconductor element and the freewheeling diode made of such a wide bandgap semiconductor have high withstand voltage and large allowable current density, the self-arc-extinguishing type semiconductor element and the freewheeling diode can be downsized. Therefore, by using downsized self-arc-extinguishing type semiconductor elements and freewheeling diodes, downsizing of the power semiconductor module in which these elements are embedded is enabled.

While increasing the switching frequency is possible due to low power loss, decreasing inductance of the power semiconductor module is requested when high-speed switching is performed. If the wide bandgap semiconductor is used in the power semiconductor module according to the present invention, a surge voltage at the high-speed switching can be reduced, and thus increasing the switching frequency is enabled. With the increase of the switching frequency, downsizing of the power conversion device in which the power semiconductor module is embedded is enabled. Note that, while it is desirable that both of the self-arc-extinguishing type semiconductor element and the freewheeling diode are made of the wide bandgap semiconductor, the effect of the present invention can be obtained even if either one of the element and the diode is made of a wide bandgap semiconductor.

REFERENCE NUMERALS

1 base plate; 2 ceramic insulation layer; 3, 4 wiring patterns; 5 ceramic insulation substrate; 6 self-arc-extinguishing type semiconductor element; 7 freewheeling diode; 8 chip resistor; 9 solder; 10, 10a, 10b AC terminals; 11, 11a, 11b positive electrode terminals; 12, 12a, 12b negative electrode terminals; 13, 14 control terminals; 13g, 13ga, 13gb positive electrode gate control terminals; 14g,14ga, 14gb negative electrode gate control terminals; 13s,13sa, 13sb positive electrode source control terminals; 14s,14sa, 14sb negative electrode source control terminals; 15, 16, 17 wire bonds; 20 molding resin; 21 case; 22 lid; 23 nut; 30 positive electrode external bus bar; 31 negative electrode external bus bar; 32 capacitor; 33 control driver circuit board; 40 load; 100, 200, 300, 400, 500 power semiconductor modules; and 101, 102 circuit blocks.

The invention claimed is:

1. A power semiconductor module, comprising:
a first set of an upper arm and a lower arm which includes a positive switching element and a negative switching element which are series-connected to each other, the positive switching element having a plurality of self-arc extinguishing type semiconductor elements parallel-connected to each other, the negative switching element having a plurality of self-arc extinguishing type semiconductor elements parallel-connected to each other;
a second set of an upper arm and a lower arm which includes a positive switching element and a negative switching element which are series-connected to each other, the positive switching element having a plurality of self-arc extinguishing type semiconductor elements parallel-connected to each other, the negative switching element having a plurality of self-arc extinguishing type semiconductor elements parallel-connected to each other, the second set of an upper arm and a lower arm being connected in parallel to the first set of an upper arm and a lower arm;
a first positive electrode side DC terminal connected to the positive switching element of the first set of an upper arm and a lower arm;
a second positive electrode side DC terminal connected to the positive switching element of the second set of an upper arm and a lower arm;
a first negative electrode side DC terminal connected to the negative switching element of the first set of an upper arm and a lower arm;
a second negative electrode side DC terminal connected to the negative switching element of the second set of an upper arm and a lower arm;
a first AC terminal connected to both of the positive switching element and the negative switching element of the first set of an upper arm and a lower arm;
a second AC terminal connected to both of the positive switching element and the negative switching element of the second set of an upper arm and a lower arm;
a first wiring pattern which connects the first set of an upper arm and a lower arm to the first positive electrode side DC terminal, the first negative electrode side DC terminal, and the first AC terminal; and
a second wiring pattern which connects the second set of an upper arm and a lower arm to the second positive electrode side DC terminal, the second negative electrode side DC terminal, and the second AC terminal, wherein
an outline of the power semiconductor module has a substantially quadrangular surface;
the first and second positive electrode side DC terminals and the first and second negative electrode side DC terminals are disposed at a side of the substantially quadrangular surface;
the first and second AC terminals are disposed at a side which is opposite to the side; and
the first positive electrode side DC terminal and the first negative electrode side DC terminal are disposed in mirror symmetry with the second positive electrode side DC terminal and the second negative electrode side DC terminal.

2. The power semiconductor module in claim 1, wherein the first AC terminal is disposed in mirror symmetry with the second AC terminal based on a symmetrical axis; and
the first wiring pattern is disposed in mirror symmetry with the second wiring pattern based on the same symmetrical axis for the AC patterns.

3. The power semiconductor module in claim 1, wherein the first positive electrode side DC terminal and the first negative electrode side DC terminal are disposed in mirror symmetry with the second positive electrode side DC terminal and the second negative electrode side DC terminal based on a right-angle axis with the side of the substantially quadrangular surface where the positive electrode side DC terminals and the negative electrode side DC terminals are disposed.

4. The power semiconductor module in claim 1, wherein the first wiring pattern is disposed in mirror symmetry with the second wiring pattern based on a right-angle axis with the side of the substantially quadrangular surface where the positive electrode side DC terminals and the negative electrode side DC terminals are disposed.

5. The power semiconductor module in claim 1, wherein the first wiring pattern has a first negative electrode terminal pattern portion which connects the first set of an upper arm and a lower arm to the first negative electrode side DC terminal;
the second wiring pattern has a second negative electrode terminal pattern portion which connects the second set of an upper arm and a lower arm to the second negative electrode side DC terminal; and
the first negative electrode terminal pattern portion is connected to the second negative electrode terminal pattern portion in the power semiconductor module.

6. The power semiconductor module in claim 1, wherein the first wiring pattern has a first control wiring pattern portion connected to control electrodes of the self-arc-extinguishing type semiconductor elements of the first set of an upper arm and a lower arm;
the second wiring pattern has a second control wiring pattern portion connected to control electrodes of the self-arc-extinguishing type semiconductor elements of the second set of an upper arm and a lower arm; and
a relationship between a direction of gate charge/discharge current, flowing through the control wiring pattern portion, of the self-arc-extinguishing type semiconductor element and a direction of principal current flowing through the self-arc-extinguishing type semiconductor element is unified in the first and second set of an upper arm and a lower arms.

7. The power semiconductor module in claim 1, wherein the first AC terminal and the second AC terminal are electrically connected each other at the same electric potential.

8. The power semiconductor module in claim 1, wherein a distance between the first positive electrode side DC terminal and the first negative electrode side DC terminal is shorter than a distance between the first positive electrode side DC terminal and the first AC terminal.

9. The power semiconductor module in claim 1, wherein a distance between the first positive electrode side DC terminal and the first negative electrode side DC terminal is shorter than a distance between the first negative electrode side DC terminal and the first AC terminal.

10. The power semiconductor module in claim 1, wherein
the first positive electrode side DC terminal and the first wiring pattern are connected at a first point;
the first negative electrode side DC terminal and the first wiring pattern are connected to at a second point;
the first AC terminal and the first wiring pattern are connected at a third point; and
a distance between the first point and the second point is shorter than a distance between the second point and the third point.

11. The power semiconductor module in claim 1, wherein
the first positive electrode side DC terminal and the first wiring pattern are connected at a first point;
the first negative electrode side DC terminal and the first wiring pattern are connected to at a second point;
the first AC terminal and the first wiring pattern are connected at a third point; and
a distance between the first point and the second point is shorter than a distance between the first point and the third point.

12. The power semiconductor module in claim 1, wherein the self-arc-extinguishing type semiconductor elements include any one of silicon carbide, gallium nitride based material, and diamond that have a wider bandgap than silicon.

13. A power semiconductor module, comprising:
a first set of an upper arm and a lower arm which includes a positive switching element and a negative switching element which are series-connected to each other, the positive switching element having a plurality of self-arc extinguishing type semiconductor elements parallel-connected to each other, the negative switching element having a plurality of self-arc extinguishing type semiconductor elements parallel-connected to each other;
a second set of an upper arm and a lower arm which includes a positive switching element and a negative switching element which are series-connected to each other, the positive switching element having a plurality of self-arc extinguishing type semiconductor elements parallel-connected to each other, the negative switching element having a plurality of self-arc extinguishing type semiconductor elements parallel-connected to each other, the second set of an upper arm and a lower arm being connected in parallel to the first set of an upper arm and a lower arm;
a first positive electrode side DC terminal connected to the positive switching element of the first set of an upper arm and a lower arm;
a second positive electrode side DC terminal connected to the positive switching element of the second set of an upper arm and a lower arm;
a first negative electrode side DC terminal connected to the negative switching element of the first set of an upper arm and a lower arm;
a second negative electrode side DC terminal connected to the negative switching element of the second set of an upper arm and a lower arm;
a first AC terminal connected to both of the positive switching element and the negative switching element of the first set of an upper arm and a lower arm;
a second AC terminal connected to both of the positive switching element and the negative switching element of the second set of an upper arm and a lower arm;
a first wiring pattern which connects the first set of an upper arm and a lower arm to the first positive electrode side DC terminal, the first negative electrode side DC terminal, and the first AC terminal; and
a second wiring pattern which connects the second set of an upper arm and a lower arm to the second positive electrode side DC terminal, the second negative electrode side DC terminal, and the second AC terminal, wherein
an outline of the power semiconductor module has a substantially quadrangular surface;
the first and second positive electrode side DC terminals, the first and second negative electrode side DC terminals, and the first and second AC terminals are disposed within the substantially quadrangular surface in an order of the positive electrode side DC terminal, the negative electrode side DC terminal, and the AC terminal; and
the first positive electrode side DC terminal and the first negative electrode side DC terminal are disposed in mirror symmetry with the second positive electrode side DC terminal and the second negative electrode side DC terminal.

14. The power semiconductor module in claim 13, wherein
the first AC terminal is disposed in mirror symmetry with the second AC terminal based on a symmetrical axis; and
the first wiring pattern is disposed in mirror symmetry with the second wiring pattern based on the same symmetrical axis for the AC patterns.

15. The power semiconductor module in claim 13, wherein
the first AC terminal and the second AC terminal are electrically connected each other at the same electric potential.

16. The power semiconductor module in claim 13, wherein
a distance between the first positive electrode side DC terminal and the first negative electrode side DC terminal is shorter than a distance between the first positive electrode side DC terminal and the first AC terminal.

17. The power semiconductor module in claim 13, wherein
a distance between the first positive electrode side DC terminal and the first negative electrode side DC terminal is shorter than a distance between the first negative electrode side DC terminal and the first AC terminal.

18. The power semiconductor module in claim 13, wherein
the first positive electrode side DC terminal and the first wiring pattern are connected at a first point;

the first negative electrode side DC terminal and the first wiring pattern are connected to at a second point;

the first AC terminal and the first wiring pattern are connected at a third point; and a distance between the first point and the second point is shorter than a distance between the second point and the third point.

19. The power semiconductor module in claim 13, wherein the first positive electrode side DC terminal and the first wiring pattern are connected at a first point;

the first negative electrode side DC terminal and the first wiring pattern are connected to at a second point;

the first AC terminal and the first wiring pattern are connected at a third point; and a distance between the first point and the second point is shorter than a distance between the first point and the third point.

20. The power semiconductor module in claim 13, wherein the self-arc-extinguishing type semiconductor elements include any one of silicon carbide, gallium nitride based material, and diamond that have a wider bandgap than silicon.

* * * * *